United States Patent
Oh

(10) Patent No.: US 9,704,988 B2
(45) Date of Patent: Jul. 11, 2017

(54) DUAL WORK FUNCTION BURIED GATE TYPE TRANSISTOR AND METHOD FOR FABRICATING THE SAME

(71) Applicant: SK hynix Inc., Gyeonggi-do (KR)

(72) Inventor: Tae-Kyung Oh, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 61 days.

(21) Appl. No.: 14/322,671

(22) Filed: Jul. 2, 2014

(65) Prior Publication Data

US 2015/0214362 A1  Jul. 30, 2015

(30) Foreign Application Priority Data

Jan. 29, 2014  (KR) .................. 10-2014-0011574

(51) Int. Cl.
| | | |
|---|---|---|
| H01L 29/78 | (2006.01) | |
| H01L 29/423 | (2006.01) | |
| H01L 29/66 | (2006.01) | |
| H01L 29/40 | (2006.01) | |

(52) U.S. Cl.
CPC ........ *H01L 29/7827* (2013.01); *H01L 29/401* (2013.01); *H01L 29/4236* (2013.01); *H01L 29/66484* (2013.01); *H01L 29/66666* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 6,166,417 A * | 12/2000 | Bai | H01L 21/28088 257/388 |
| 8,008,144 B2 | 8/2011 | Ananthan et al. | |
| 8,034,701 B2 | 10/2011 | Lee et al. | |
| 2002/0135007 A1* | 9/2002 | Koike | H01L 27/10829 257/301 |
| 2005/0104093 A1* | 5/2005 | Yoshimochi | H01L 29/7813 257/224 |
| 2008/0211057 A1* | 9/2008 | Lee | H01L 27/10891 257/520 |
| 2010/0240180 A1* | 9/2010 | Jeon | H01L 21/823437 438/239 |
| 2011/0001186 A1* | 1/2011 | Seo | H01L 21/823437 257/330 |
| 2011/0108928 A1* | 5/2011 | Tao | H01L 21/3215 257/410 |
| 2011/0180868 A1* | 7/2011 | Jang | H01L 27/10876 257/330 |

(Continued)

*Primary Examiner* — Brett Feeney
*Assistant Examiner* — Erik T Peterson
(74) *Attorney, Agent, or Firm* — IP & T Group LLP

(57) ABSTRACT

A transistor may include a source region and a drain region separately formed in a substrate, a trench defined in the substrate between the source region and the drain region, and a buried gate electrode formed. The buried gate electrode includes a high work function liner layer having a bottom portion which is positioned over a bottom of the trench and sidewall portions which are positioned on lower sidewalls of the trench; a low work function liner layer positioned on upper sidewalls of the trench, and overlapping with the source region and the drain region; and a low resistance layer contacting the high work function liner layer and the low work function liner layer, and partially filling the trench.

4 Claims, 19 Drawing Sheets

(56) References Cited

U.S. PATENT DOCUMENTS

| | | | |
|---|---|---|---|
| 2012/0043614 A1* | 2/2012 | Choi | H01L 27/0629 257/369 |
| 2012/0126885 A1* | 5/2012 | Juengling | H01L 21/823431 327/581 |
| 2012/0168859 A1* | 7/2012 | Jin | H01L 29/407 257/330 |
| 2013/0161734 A1 | 6/2013 | Wu | |
| 2014/0008720 A1* | 1/2014 | Xie | H01L 27/092 257/331 |
| 2014/0061781 A1* | 3/2014 | Kim | H01L 27/10876 257/331 |
| 2014/0110778 A1* | 4/2014 | Fumitake | H01L 29/78 257/330 |
| 2014/0159145 A1* | 6/2014 | Park | H01L 29/66621 257/330 |
| 2015/0214313 A1* | 7/2015 | Oh | H01L 27/10876 257/2 |
| 2015/0214314 A1* | 7/2015 | Oh | H01L 29/4236 257/330 |
| 2015/0228491 A1* | 8/2015 | Kang | H01L 21/28194 257/330 |

\* cited by examiner

DUAL WORK FUNCTION BURIED GATE TYPE TRANSISTOR AND METHOD FOR FABRICATING THE SAME

CROSS-REFERENCE TO RELATED APPLICATIONS

The present application claims priority of Korean Patent Application No. 10-2014-0011574, filed on Jan. 29, 2014, which is incorporated herein by reference in its entirety.

BACKGROUND

1. Field

Exemplary embodiments of the present invention relate to a transistor, and more particularly, to a dual work function buried gate type transistor and a method for fabricating the same.

2. Description of the Related Art

A metal gate electrode is applied to a transistor. Gate resistance may be decreased by a metal gate electrode having a low resistance. Additionally, since the metal gate electrode has a high work function, channel dose may be decreased, leakage current may be reduced, and the performance of the transistor may be improved.

However, a problem may be caused by the high work function since gate-induced drain leakage (GIDL) increases where the metal gate electrode and impurity regions overlap, that is, the source/drain regions. Particularly, since the overlap area between a buried metal gate electrode and source/drain regions is large, it may be difficult to reduce gate-induced drain leakage (GIDL) in a buried gate type transistor.

To reduce gate-induced drain leakage (GIDL), the height of the buried metal gate electrode may be lowered. Accordingly, the overlap area between the buried metal gate electrode and the source/drain regions may be minimized.

If the height of the buried metal gate electrode is lowered, an issue is likely to be caused in that gate resistance increases and the current drivability of the transistor is degraded.

Hence, an improved trade-off characteristic between gate-induced drain leakage (GIDL) and current drivability is desirable.

SUMMARY

Various embodiments of the present invention are directed to a buried gate type transistor and a method for fabricating the same that reduce gate-induced drain leakage and improve current drivability.

In an embodiment of the present invention, a transistor may include a source region and a drain region which are separately formed in a substrate, a trench which is defined in the substrate between the source region and the drain region, and a buried gate electrode which is formed in the trench, the buried gate electrode including: a high work function liner layer having a bottom portion which is positioned over a bottom of the trench and sidewall portions which are positioned on lower sidewalls of the trench; a low work function liner layer positioned on upper sidewalls of the trench, and overlapping with the source region and the drain region; and a low resistance layer contacting the high work function liner layer and the low work function liner layer, and partially filling the trench.

In an embodiment of the present invention, a transistor may include: an isolation layer formed in a substrate, and defining an active region; a source region and a drain region formed in the active region to be separated from each other; a trench defined in the active region between the source region and the drain region, and extending into the isolation layer; a fin region formed in the active region under the trench; and a buried gate electrode covering the fin region, and positioned in the trench, the buried gate electrode including: a high work function liner layer having a bottom portion which is positioned over a bottom of the trench and sidewall portions which extend from the bottom portion and are positioned on sidewalls of the trench; a low work function liner layer extending from the sidewall portions of the high work function liner layer, and overlapping with the source region and the drain region; a low resistance layer contacting the high work function liner layer and the low work function liner layer, and partially filling the trench; and a barrier layer interposed between the low resistance layer and the high work function liner layer and the low work function liner layer.

In an embodiment of the present invention, a method for fabricating a transistor may include: defining a trench in a substrate; forming a lower buried gate electrode which includes a high work function layer positioned over a bottom and on sidewalls of the trench and partially fills the trench; forming an upper buried gate electrode which includes a low work function layer positioned on the sidewalls of the trench over the lower buried gate electrode and partially fills the trench; forming a capping layer over the upper buried gate electrode; and forming a source region and a drain region which are separated from each other by the trench and have a depth overlapping with the low work function layer, in the substrate.

In an embodiment of the present invention, a method for fabricating a transistor may include: defining a trench in a substrate; forming a P-type polysilicon layer over a top surface of the substrate, and on a bottom and on sidewalls of the trench; forming a protective layer which partially fills the trench, over the P-type polysilicon layer; converting an exposed portion of the P-type polysilicon layer which is exposed by the protective layer, into an N-type polysilicon layer; removing the protective layer; forming a barrier layer over the P-type polysilicon layer and the N-type polysilicon layer; forming a low resistance layer which fills the trench, over the barrier layer; recessing the low resistance layer, the barrier layer and the N-type polysilicon layer to form a buried gate electrode; forming a capping layer over the buried gate electrode; and forming a source region and a drain region, which have a depth overlapping with the low work function layer, in the substrate.

In an embodiment of the present invention, a memory cell may include: a buried gate type transistor including a gate electrode which is positioned in a trench defined in a substrate, and a source region and a drain region which are formed in the substrate to be separated from each other by the trench; a memory element connected to any one region of the source region and the drain region; and a bit line connected to the other region of the source region and the drain region, the gate electrode including: a high work function polysilicon layer having a bottom portion which is positioned over a bottom of the trench and sidewall portions which extend from the bottom portion and are positioned on sidewalls of the trench; a low work function polysilicon layer extending from the sidewall portions of the high work function polysilicon layer, and overlapping with the source region and the drain region; a low resistance metal layer contacting the high work function polysilicon layer and the low work function polysilicon layer, and partially filling the trench; and a barrier layer interposed between the low resistance metal layer and the high work function polysilicon layer and the low work function polysilicon layer.

In an embodiment of the present invention, an electronic device may include a plurality of transistors, at least any one transistor of the plurality of transistors including: a buried gate electrode positioned in a trench which is defined in a substrate; and a source region and a drain region formed in the substrate to be separated from each other by the trench, the buried gate electrode including: a high work function polysilicon layer having a bottom portion which is positioned over a bottom of the trench and sidewall portions which extend from the bottom portion and are positioned on sidewalls of the trench; a low work function polysilicon layer extending from the sidewall portions of the high work function polysilicon layer, and overlapping with the source region and the drain region; a low resistance metal layer contacting the high work function polysilicon layer and the low work function polysilicon layer, and partially filling the trench; and a barrier layer interposed between the low resistance metal layer and the high work function polysilicon layer and the low work function polysilicon layer.

DETAILED DESCRIPTION

Figure 1:
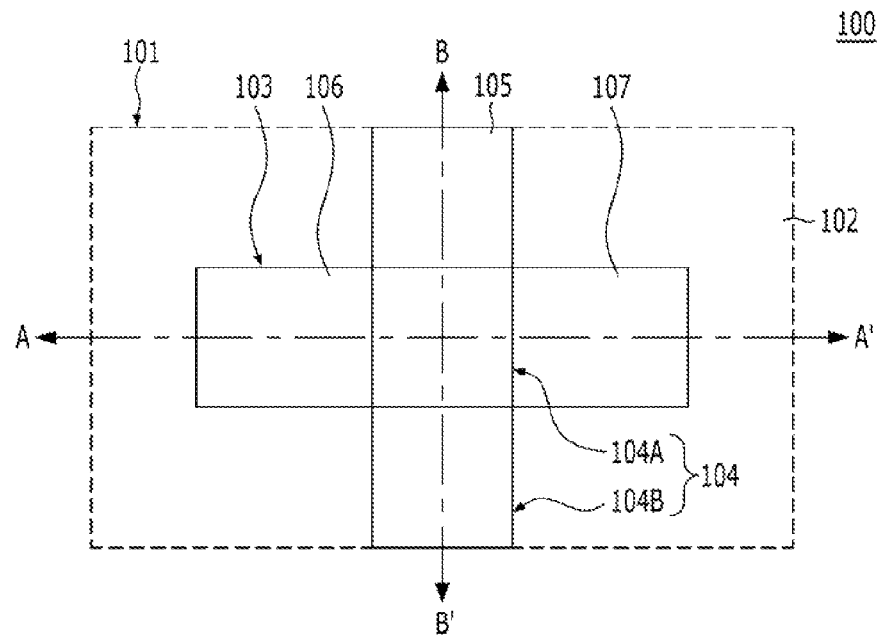
FIG. 1 is a plan view illustrating a transistor in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Also, it is noted that in this specification, "connected/coupled" refers to one component not only directly coupling another component but also indirectly coupling another component through an intermediate component. In addition, a singular form may include a plural form, and vice versa, as long as it is not specifically mentioned.

FIG. 1 is a plan view illustrating a transistor in accordance with embodiments of the present invention.

Referring to FIG. 1, a transistor 100 includes a buried gate electrode 105, a first impurity region 106, and a second impurity region 107. An isolation layer 102 and an active region 103 are formed in a substrate 101. A trench 104 is defined to extend across the active region 103 and the isolation layer 102. The buried gate electrode 105 is formed in the trench 104. The first impurity region 106 and the second impurity region 107 are separated by the trench 104. The trench 104 includes a first trench 104A and a second trench 104B. The first trench 104A is defined in the active region 103. The second trench 104B is defined in the isolation layer 102. The first trench 104A and the second trench 104B may communicate with each other.

Figure 2A:
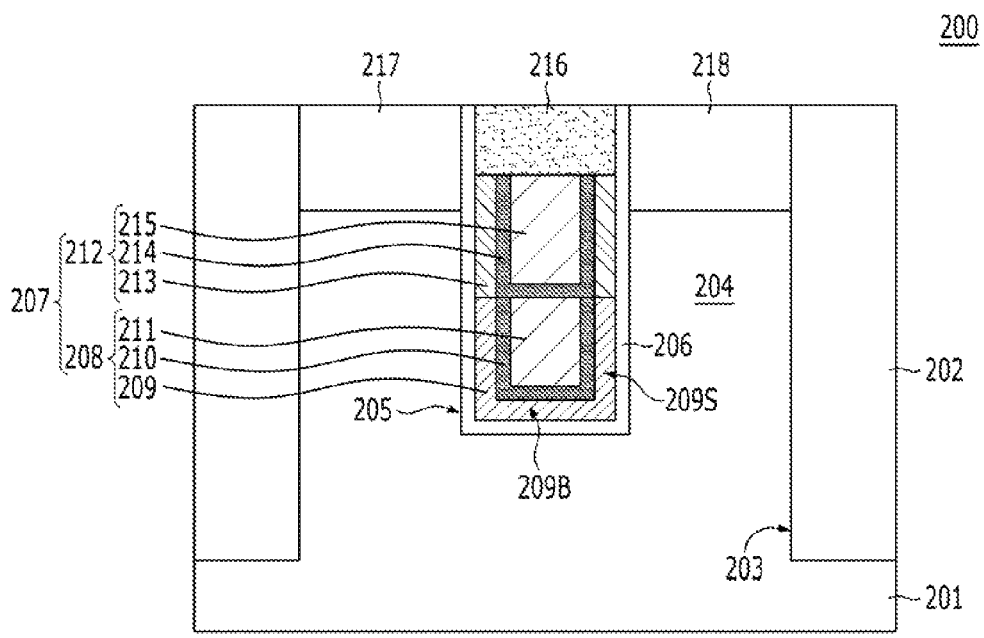
FIGS. 2A and 2B are views illustrating a transistor in accordance with a first embodiment of the present invention.
Figure 2B:
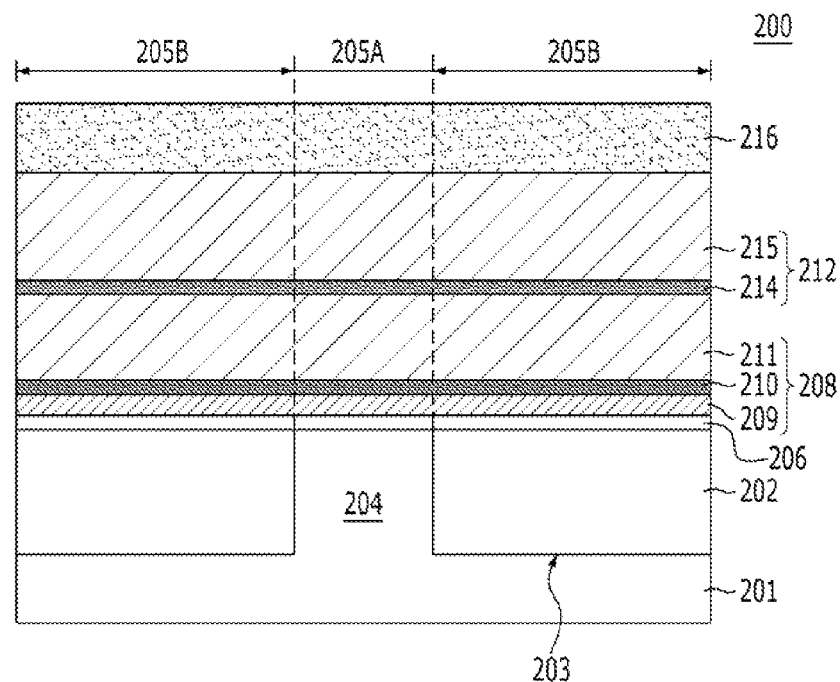

FIGS. 2A and 2B are views illustrating a transistor in accordance with a first embodiment of the present invention. FIG. 2A is a cross-sectional view taken along the line A-A' of FIG. 1. FIG. 2B is a cross-sectional view taken along the line B-B' of FIG. 1.

A transistor 200 is formed in a substrate 201. The substrate 201 may include a semiconductor substrate. The substrate 201 may be a silicon substrate. An isolation layer 202 is formed in the substrate 201. The isolation layer 202 is filled in an isolation trench 203. An active region 204 is defined in the substrate 201 by the isolation layer 202.

A trench 205 which has a predetermined depth is defined in the substrate 201. The trench 205 may be a line type which extends in any one direction. The trench 205 has a shape which extends across the active region 204 and the isolation layer 202. The trench 205 has a depth that is shallower than the isolation trench 203. The trench 205 includes a first trench 205A and a second trench 205B, shown in FIG. 2B. The first trench 205A is defined in the active region 204. The second trench 205B is defined in the isolation layer 202. The first trench 205A and the second trench 205B may communicate with each other. The bottom surface of the first trench 205A and the bottom surface of the second trench 205B may be positioned at the same level.

A first impurity region 217 and a second impurity region 218 are formed in the active region 204. Each of the first impurity region 217 and the second impurity region 218 is doped with a conductivity type impurity. For example, the conductivity type impurity may include phosphorus (P) or boron (B). The first impurity region 217 and the second impurity region 218 are formed in the active region 204 on both sides of the trench 205. The first impurity region 217 and the second impurity region 218 respectively correspond to a source region and a drain region. The bottom surfaces of the first impurity region 217 and the second impurity region 218 may be positioned at a predetermined depth from the top surface of the active region 204. The first impurity region 217 and the second impurity region 218 may define the sidewalls of the trench 205. The bottom surfaces of the first impurity region 217 and the second impurity region 218 may be higher than the bottom surface of the trench 205.

A gate dielectric layer 206 is formed on the bottom surface and the sidewalls of the trench 205. The gate dielectric layer 206 may include at least one selected from a silicon oxide, a silicon nitride, a silicon oxynitride and a high-k (dielectric constant) material. The high-k material may be a material which has a dielectric constant higher than the dielectric constants of a silicon oxide and a silicon nitride.

A buried gate electrode 207 is formed in the trench 205. The buried gate electrode 207 includes a lower buried gate electrode 208 and an upper buried gate electrode 212.

The lower buried gate electrode 208 includes a first liner layer 209, a first barrier layer 210 and a first low resistance layer 211. The upper buried gate electrode 212 includes a second liner layer 213, a second barrier layer 214 and a second low resistance layer 215. The first low resistance layer 211 is partially filled in the trench 205. The first liner layer 209 is positioned between the first low resistance layer 211 and the gate dielectric layer 206. The first liner layer 209 has a bottom portion 209B and sidewall portions 209S which vertically extend from the bottom portion 209B. The bottom portion 209B of the first liner layer 209 is positioned on the bottom of the trench 205. The sidewall portions 209S of the first liner layer 209 are positioned on the sidewalls of the trench 205. The first barrier layer 210 is positioned between the first liner layer 209 and the first low resistance layer 211. The second low resistance layer 215 is partially filled in the trench 205 on the lower buried gate electrode 208. The second liner layer 213 is positioned between the second low resistance layer 215 and the gate dielectric layer 206. The second barrier layer 214 is positioned between the second liner layer 213 and the second low resistance layer 215. The second liner layer 213 may have the shape of a sidewall spacer which extends from the sidewalls of the first liner layer 209. The second barrier layer 214 is positioned between the second low resistance layer 215 and the first low resistance layer 211 so that the second liner layer 213 is not interposed therebetween. The first liner layer 209 and the second liner layer 213 are connected with each other. The heights of the top surfaces of the first liner layer 209, the first barrier layer 210 and the first low resistance layer 211 may be the same. The heights of the top surfaces of the second liner layer 213, the second barrier layer 214 and the second low resistance layer 215 may be the same. A capping layer 216 is gap-filled on the upper buried gate electrode 212.

The capping layer 216 plays the role of protecting the buried gate electrode 207. The capping layer 216 includes a dielectric material. The capping layer 216 may include a silicon nitride.

The buried gate electrode 207 will be described below in detail.

The first liner layer 209 and the second liner layer 213 include different work function materials. The work function of the first liner layer 209 is higher than the work function of the second liner layer 213. The first liner layer 209 includes a high work function material. The second liner layer 213 includes a low work function material. The high work function material has a work function larger than the mid-gap work function of silicon. The low work function material has a worker function smaller than the mid-gap work function of silicon. The high work function material has a work function larger than approximately 4.5 eV. The low work function material has a work function smaller than approximately 4.5 eV. The first liner layer 209 and the second liner layer 213 include polysilicons which have different work functions. The first liner layer 209 may include a P-type polysilicon, and the second liner layer 213 may include an N-type polysilicon. The first liner layer 209 may include a polysilicon, which is introduced with a P-type impurity such as boron. The second liner layer 213 may include a polysilicon, which is introduced with an N-type impurity such as phosphorus or arsenic. The second liner layer 213 may be formed by implanting an N-type impurity into a P-type polysilicon.

The first liner layer 209 does not overlap with the first impurity region 217 and the second impurity region 218. The second liner layer 213 partially overlaps with the first impurity region 217 and the second impurity region 218. Since the second liner layer 213 has a low work function, it may be possible to prevent gate-induced drain leakage (GIDL) from occurring in the first impurity region 217 and the second impurity region 218, by the second liner layer 213. A threshold voltage is controlled by the high work function of the first liner layer 209. For example, a channel dose may be decreased by the high work function of the first liner layer 209.

The first low resistance layer 211 includes a material which has specific resistance lower than the first liner layer 209. The second low resistance layer 215 includes a material which has specific resistance lower than the second liner layer 213. The first low resistance layer 211 and the second low resistance layer 215 may be formed of the same material. The resistance of the buried gate electrode 207 is decreased by the first low resistance layer 211 and the second low resistance layer 215. The first low resistance layer 211 and the second low resistance layer 215 include a low resistance metal-containing material. The first low resistance layer 211 and the second low resistance layer 215 may include tungsten. Accordingly, the first low resistance layer 211 and the second low resistance layer 215 include a metal-containing material, and the first liner layer 209 and the second liner layer 213 include a non-metal material. Therefore, to decrease the resistance of the buried gate electrode 207, the first liner layer 209 and the second liner layer 213 are formed to a thin thickness.

The first barrier layer 210 prevents the reaction of the first liner layer 209 and the first low resistance layer 211. The first barrier layer 210 includes a metal-containing material which has specific resistance lower than the first liner layer 209. The first barrier layer 210 includes a titanium-containing material. For example, the first barrier layer 210 may include a titanium nitride. By utilizing the first barrier layer 210 in this manner, the reaction of the first liner layer 209 and the first low resistance layer 211 may be suppressed, and accordingly, leakage current may be advantageously reduced. The second barrier layer 214 prevents the reaction of the second liner layer 213 and the second low resistance layer 215. The second barrier layer 214 includes a metal-containing material which has a specific resistance lower than the second liner layer 213. The second barrier layer 214 includes a titanium-containing material. For example, the second barrier layer 214 may include a titanium nitride. By utilizing the second barrier layer 214 in this manner, the reaction of the second liner layer 213 and the second low resistance layer 215 may be suppressed, and accordingly, leakage current may be advantageously reduced.

The channel of the transistor 200 may be defined along the trench 205 between the first impurity region 217 and the second impurity region 218. The buried gate electrode 207 becomes a dual work function buried gate (BG) electrode. The dual work function buried gate electrode includes the first liner layer 209 which has a high work function and the second liner layer 213 which has a low work function.

Figure 3A:
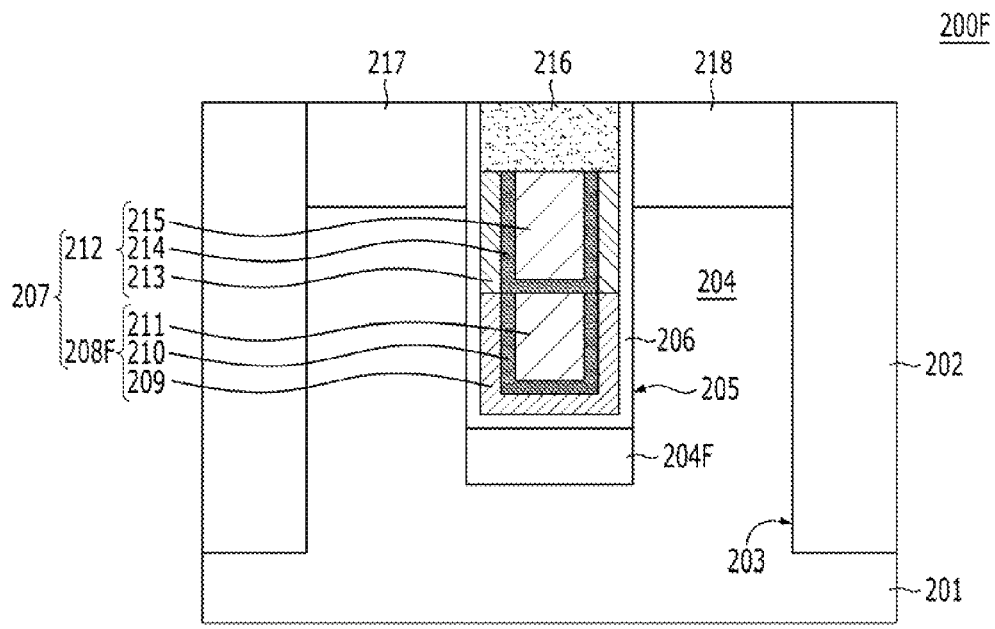
FIGS. 3A and 3B are views illustrating a transistor in accordance with a second embodiment of the present invention.
Figure 3B:
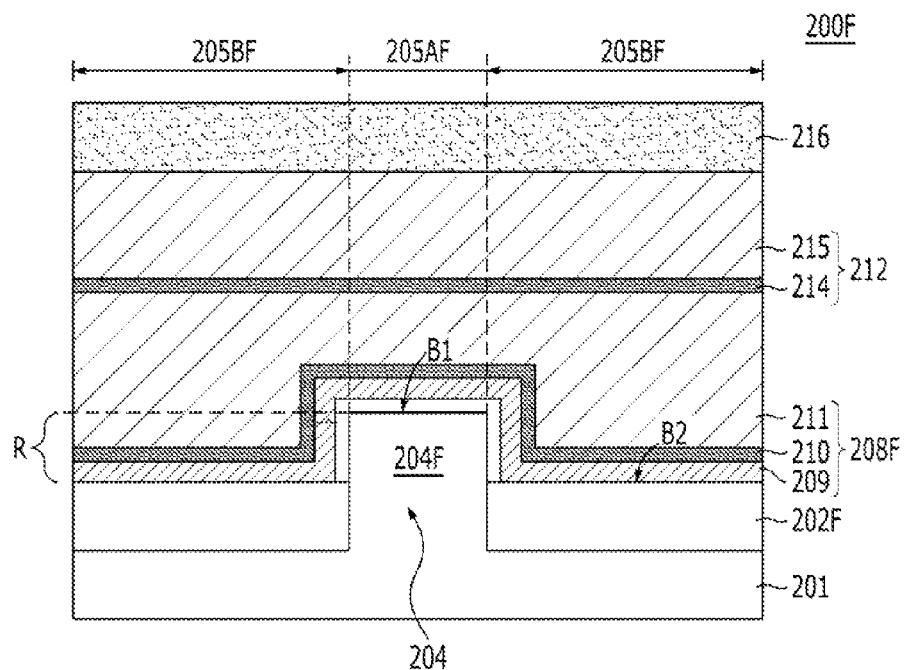

FIGS. 3A and 3B are views illustrating a transistor in accordance with a second embodiment of the present invention. FIG. 3A is a cross-sectional view taken along the line A-A' of FIG. 1. FIG. 3B is a cross-sectional view taken along the line B-B' of FIG. 1. Some components of a transistor 200F in accordance with the second embodiment of the present invention may be the same as those of the transistor 200 in accordance with the first embodiment of the present invention. Detailed descriptions for the same components will be omitted.

Referring to FIGS. 3A and 3B, a trench 205 includes a first trench 205AF and a second trench 205BF as shown in FIG. 3B. The first trench 205AF is defined in an active region 204. The second trench 205BF is defined in an isolation layer 202. The first trench 205AF and the second trench 205BF may communicate with each other. In the trench 205, the first trench 205AF and the second trench 205BF may have bottom surfaces which are positioned at different levels. For example, a bottom surface B1 of the first trench 205AF may be positioned at a higher level than a bottom surface B2 of the second trench 205BF. The height difference between the first trench 205AF and the second trench 205BF is induced as the isolation layer 202 is recessed on the bottom of the trench 205. The second trench 205BF of the trench 205 includes a recess region R which has the bottom surface B2 lower than the bottom surface B1 of the first trench 205AF.

Due to the step portion formed between the first trench 205AF and the second trench 205BF of the trench 205, a fin region 204F is formed in the active region 204. The fin region 204F is formed on the bottom of the trench 205, and the sidewalls of the fin region 204F are exposed by the recess region R. The fin region 204F serves as a portion where a channel is to be formed. The fin region 204F is referred to as a saddle fin. By the fin region 204F, a channel width may be increased, and an electrical characteristic may be improved. The lower portion of the fin region 204F is buried by a recessed isolation layer 202F.

A gate dielectric layer 206 is formed on the sidewalls and the top surface of the fin region 204F. A lower buried gate electrode 208F has a shape which covers the sidewalls and the top surface of the fin region 204F. The lower buried gate electrode 208F is formed in the trench 205 while filling the recess region R. The cross-sectional area of the lower buried gate electrode 208F is wider in the isolation layer 202 than in the active region 204. An upper buried gate electrode 212 is not positioned close to the sidewalls of the fin region 204F. The fin region 204F is influenced by the high work function of a first liner layer 209.

The transistor 200F is referred to as a buried gate type fin channel transistor.

According to the first embodiment and the second embodiment of the present invention, the low resistance of the buried gate electrode 207 is secured by the first low resistance layer 211 and the second low resistance layer 215. A channel dose may be decreased by the high work function of the first liner layer 209. Gate-induced drain leakage (GIDL) may be reduced by the low work function of the second liner layer 213. An abnormal reaction between the second liner layer 213 and the second low resistance layer 215 may be prevented by the second barrier layer 214. Accordingly, it may be possible to prevent the work function of the second liner layer 213 from increasing.

A method for fabricating the transistor in accordance with the first embodiment of the present invention will be described below. FIGS. 4A to 4H are views illustrating an exemplary method for fabricating the transistor in accordance with the first embodiment of the present invention. FIGS. 4A to 4H are cross-sectional views taken along the line A-A' of FIG. 1, showing processes.

Figure 4A:
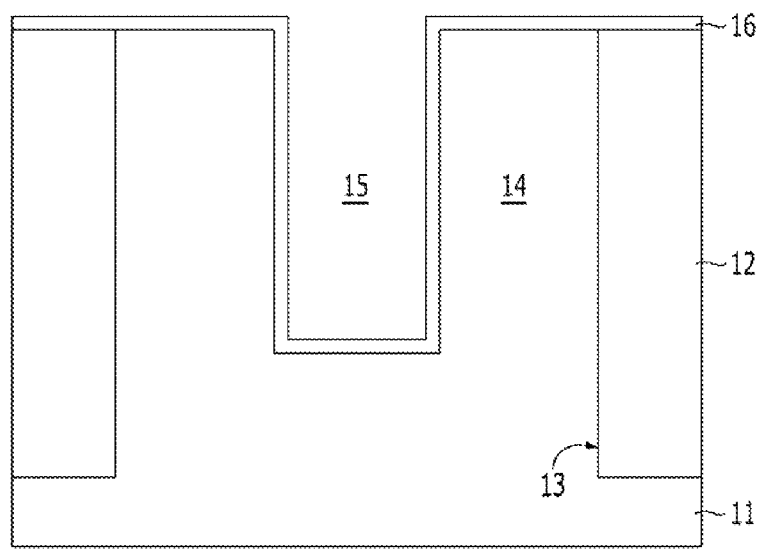
FIGS. 4A to 4H are views illustrating an exemplary method for fabricating the transistor in accordance with the first embodiment of the present invention.

As shown in FIG. 4A, an isolation layer 12 is formed in a substrate 11. An active region 14 is defined by the isolation layer 12. The isolation layer 12 may be formed through an STI (shallow trench isolation) process. For example, after forming a pad layer (not shown) on the substrate 11, the pad layer and the substrate 11 are etched using an isolation mask (not shown) to define an isolation trench 13. The isolation trench 13 is filled with a dielectric material, and accordingly, the isolation layer 12 is formed. A wall oxide, a liner and a gap-fill dielectric may be sequentially formed as the isolation layer 12. The liner may be formed by stacking a silicon nitride and a silicon oxide. The silicon nitride may include $Si_3N_4$, and the silicon oxide may include $SiO_2$. The gap-fill dielectric may include a spin-on dielectric (SOD). In another embodiment of the present invention, in the isolation layer 12, a silicon nitride may be used as the gap-fill dielectric.

A trench 15 is defined in the substrate 11. The trench 15 may be defined as a line type which extends across the active region 14 and the isolation layer 12. The trench 15 may be defined by forming a mask pattern (not shown) on the substrate 11 and performing an etching process using the mask pattern as an etch mask. The trench 15 may be defined to be shallower than the isolation trench 13.

A gate dielectric layer 16 is formed on the surface of the trench 15. The gate dielectric layer 16 may be formed through a thermal oxidation process. In another embodiment of the present invention, the gate dielectric layer 16 may be formed by chemical vapor deposition (CVD) or atomic layer deposition (ALD). The gate dielectric layer 16 may include at least one selected among a high-k material, an oxide, a nitride and an oxynitride. The high-k material may be a material which has a dielectric constant higher than the dielectric constants of silicon oxide and silicon nitride. For example, the high-k material may be at least one selected among metal oxides such as a hafnium oxide and an aluminum oxide.

Figure 4B:
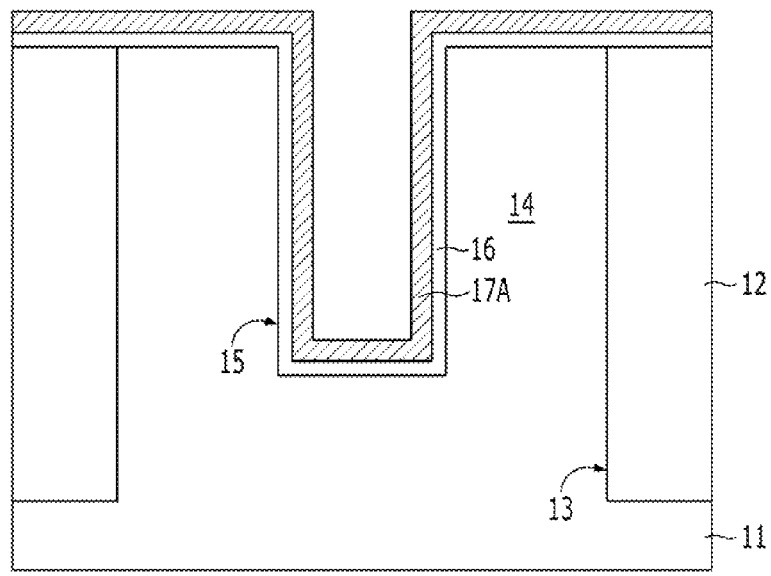

As shown in FIG. 4B, a first conductive layer 17A is formed on the gate dielectric layer 16. The first conductive layer 17A lines the surface of the gate dielectric layer 16. The first conductive layer 17A includes a first work function layer. The first work function layer has a work function larger than the mid-gap work function of silicon. The first work function layer is referred to as a "high work function layer". The first conductive layer 17A is formed of a silicon-containing material. The first conductive layer 17A is introduced with a P-type impurity to have a high work function. The first conductive layer 17A includes a P-type polysilicon. The P-type polysilicon is introduced with boron. The polysilicon introduced with boron may be formed by flowing in situ boron or a boron compound when depositing a polysilicon. In another embodiment of the present invention, after depositing an undoped polysilicon, a doping process of boron or a boron compound may be performed.

The doping process may include implantation, plasma doping or another doping technology.

Figure 4C:
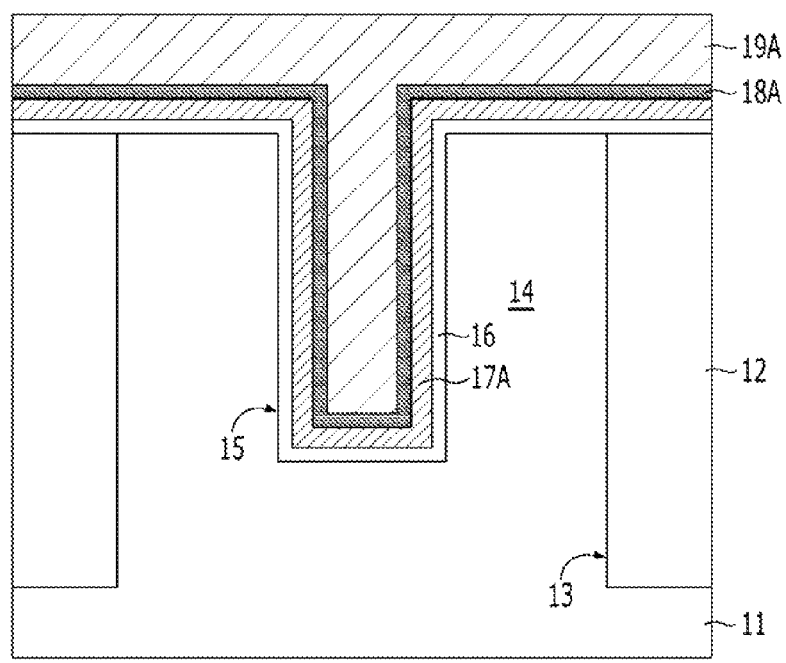

As shown in FIG. 4C, a second conductive layer 18A is formed on the first conductive layer 17A. The second conductive layer 18A lines the surface of the first conductive layer 17A. The second conductive layer 18A and the first conductive layer 17A may be different materials. The second conductive layer 18A becomes a barrier layer. The second conductive layer 18A may be formed of a metal-containing material. The second conductive layer 18A may include a metal nitride. For example, the second conductive layer 18A may include a titanium nitride.

A third conductive layer 19A is formed on the second conductive layer 18A. The third conductive layer 19A fills the trench 15. The third conductive layer 19A includes a low resistance material. The third conductive layer 19A includes a low resistance metal material. The third conductive layer 19A may include tungsten.

Figure 4D:
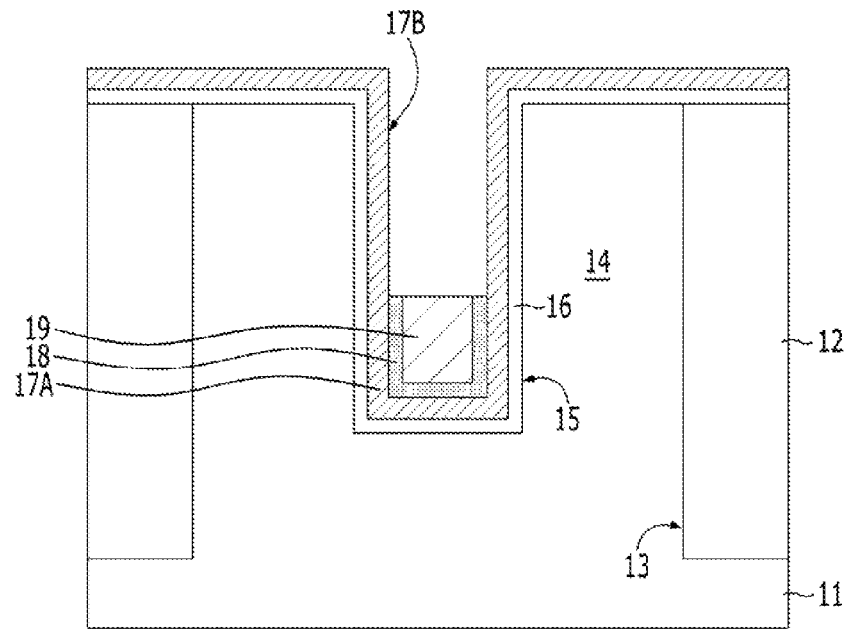

As shown in FIG. 4D, a first recessing process is performed in such a way that the second conductive layer 18A and the third conductive layer 19A remain in the trench 15. The first recessing process may be performed by an etch-back process. A first barrier layer 18 and a first low resistance layer 19 are formed. The first barrier layer 18 is formed by the etch-back process of the second conductive layer 18A shown in FIG. 4C. The first low resistance layer 19 is formed through the etch-back process of the third conductive layer 19A shown in FIG. 4C. A planarization process may be performed before an etch-back process.

By the first recessing process described above, the first conductive layer 17A is partially exposed. The lower portion of the first conductive layer 17A is covered by the first barrier layer 18. The upper portion of the first conductive layer 17A is not covered by the first barrier layer 18. The lower portion of the first conductive layer 17A corresponds to a portion which is formed on the lower sidewalls of the trench 15, and the upper portion of the first conductive layer 17A corresponds to a portion which is formed on the upper sidewalls of the trench 15 and the top surface of the substrate 11. Thus, the first conductive layer 17A has an unexposed portion (not numbered) and an exposed portion 17B.

Figure 4E:
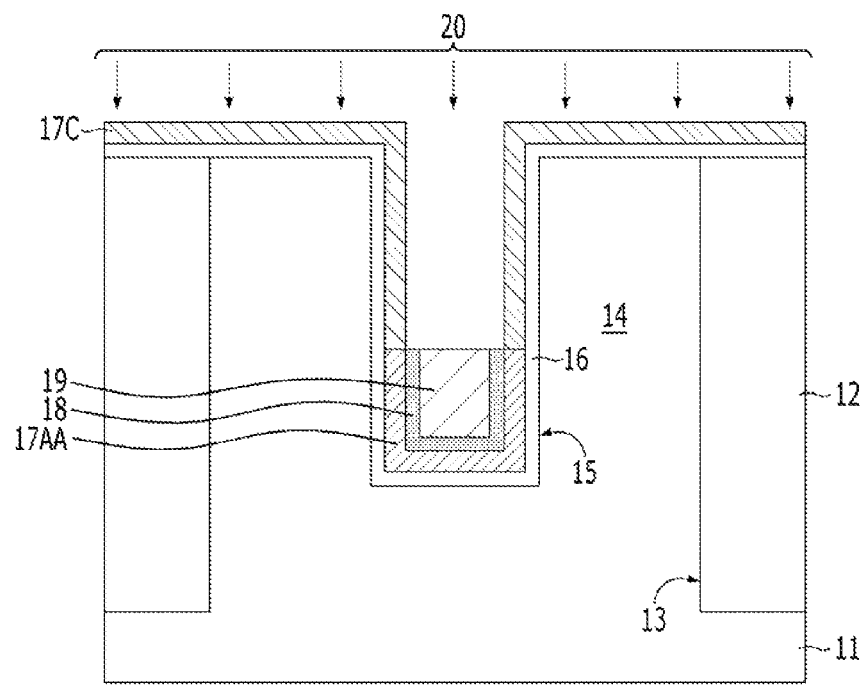

As shown in FIG. 4E, a doping process 20 for introducing a work function modulation element is performed. The doping process 20 may include plasma doping, which enables uniform doping. The work function modulation element modulates the work function of the exposed portion 17B of the first conductive layer 17A. By utilizing the work function modulation element, the work function of the exposed portion 17B of the first conductive layer 17A is decreased. An N-type impurity may be the work function modulation element. By the doping process 20, the exposed portion 17B of the first conductive layer 17A is introduced with an N-type impurity. Accordingly, the exposed portion 17B of the first conductive layer 17A is converted into an N-type polysilicon. The N-type polysilicon has a lower work function than a P-type polysilicon. The work function modulation element may include phosphorus (P) or arsenic (As).

By utilizing the doping process 20, the exposed portion 17B of the first conductive layer 17A has a low work function. The unexposed portion of the first conductive layer 17A has a high work function. Hereinafter, the unexposed portion of the first conductive layer 17A will be referred to as a high work function layer 17AA, and the exposed portion of the first conductive layer 17A will be referred to as a low work function layer 17C.

The high work function layer 17AA contacts the first barrier layer 18, and the low work function layer 17C is exposed.

Figure 4F:
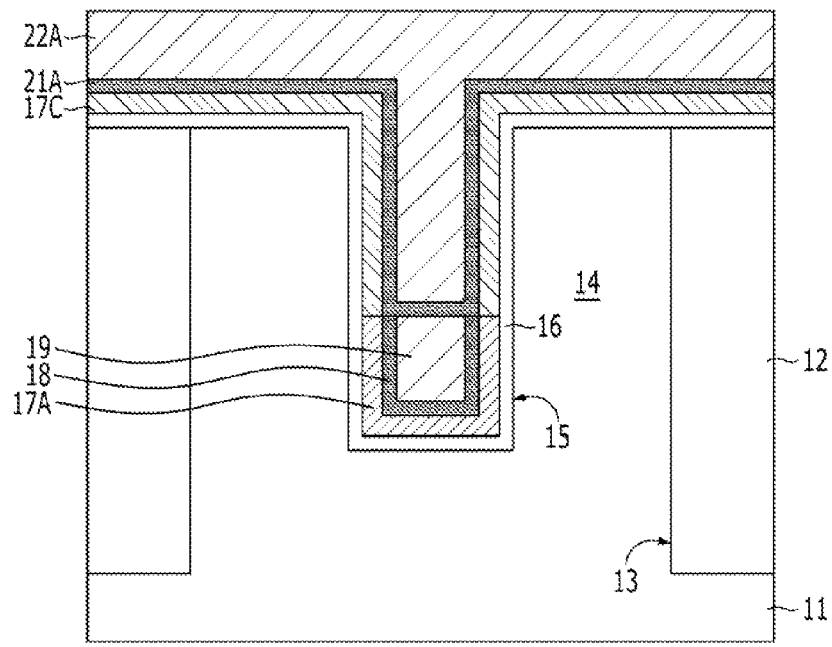

As shown in FIG. 4F, a fourth conductive layer 21A is formed on the low work function layer 17C. The fourth conductive layer 21A lines the surfaces of the low work function layer 17C and the first low resistance layer 19. The low work function layer 17C and the fourth conductive layer 21A may be different materials. The fourth conductive layer 21A becomes a second barrier layer. The fourth conductive layer 21A may be formed of a metal-containing material. The fourth conductive layer 21A may include a metal nitride. For example, the fourth conductive layer 21A may include a titanium nitride. The first barrier layer 18 and the fourth conductive layer 21A may be formed of the same material.

A fifth conductive layer 22A is formed on the fourth conductive layer 21A. The fifth conductive layer 22A fills the trench 15. The fifth conductive layer 22A includes a low resistance material. The fifth conductive layer 22A includes a low resistance metal material. The fifth conductive layer 22A may include tungsten. The first low resistance layer 19 and the fifth conductive layer 22A may be formed of the same material.

Figure 4G:
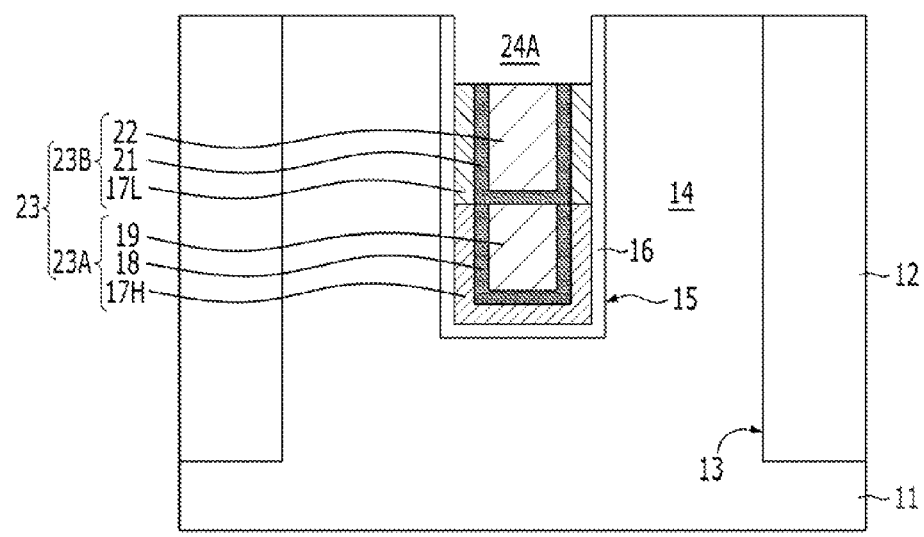

As shown in FIG. 4G, a second recessing process is performed in such a way that the low work function layer 17C, the fourth conductive layer 21A and the fifth conductive layer 22A remain in the trench 15. The second recessing process may be performed by at least an etch-back process. Accordingly, a low work function liner layer 17L, a second barrier layer 21 and a second low resistance layer 22 are formed. The low work function liner layer 17L is formed by the etch-back process of the low work function layer 17C shown in FIG. 4F. The second barrier layer 21 is formed of the etch-back process of the fourth conductive layer 21A. The second low resistance layer 22 is formed of the etch-back process of the fifth conductive layer 22A. A planarization process may be performed before an etch-back process. The high work function layer 17AA becomes a high work function liner layer 17H.

A buried gate electrode 23 is formed by the first recessing process and the second recessing process described above. The buried gate electrode 23 includes a lower buried gate electrode 23A and an upper buried gate electrode 23B. The lower buried gate electrode 23A includes the high work function liner layer 17H, the first barrier layer 18 and the first low resistance layer 19. The upper buried gate electrode 23B includes the low work function liner layer 17L, the second barrier layer 21 and the second low resistance layer 22. The low work function liner layer 17L contacts the high work function liner layer 17H. The first barrier layer 18 is positioned between the high work function liner layer 17H and the first low resistance layer 19. The first barrier layer 18 prevents the reaction of the high work function liner layer 17H and the first low resistance layer 19. The second barrier layer 21 is positioned between the low work function liner layer 17L and the second low resistance layer 22. The second barrier layer 21 prevents the reaction of the low work function liner layer 17L and the second low resistance layer 22.

The top end of the buried gate electrode 23 is positioned lower than the top surface of the substrate 11. Due to this fact, a recessed gap region 24A is defined.

Figure 4H:
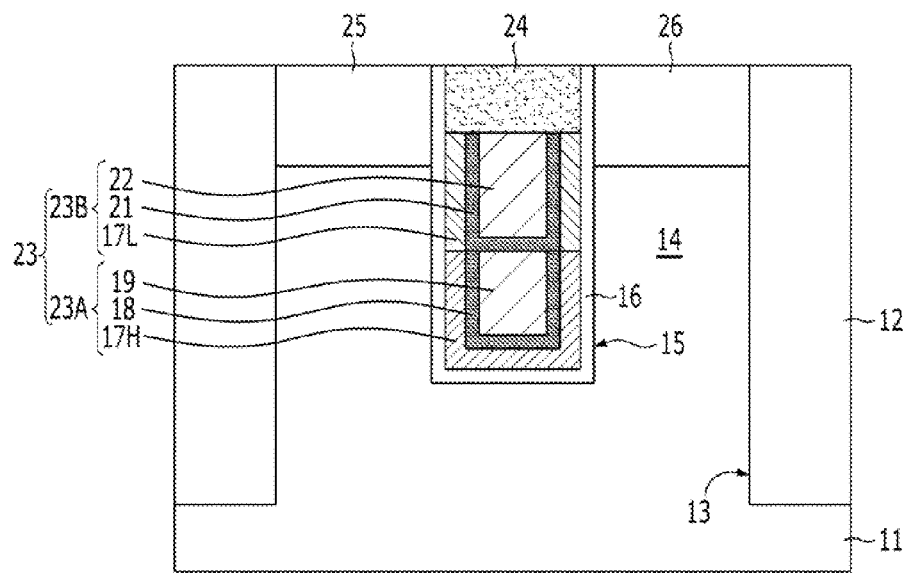

As shown in FIG. 4H, a capping layer 24 is formed on the buried gate electrode 23. The capping layer 24 includes a dielectric material. The recessed gap region 24A shown in FIG. 4G is filled with the capping layer 24. The capping layer 24 may include a silicon nitride. Subsequently, planarization of the capping layer 24 may be performed such that the top surface of the substrate 11 is exposed.

After forming the capping layer 24, a doping process of an impurity is performed, by implantation or another doping technology. Accordingly, a first impurity region 25 and a second impurity region 26 are formed in the substrate 11. When performing a doping process of an impurity, the capping layer 24 is used as a barrier. The first impurity region 25 and the second impurity region 26 respectively become a source region and a drain region.

The bottom surfaces of the first impurity region 25 and the second impurity region 26 may have a depth that overlaps with the upper buried gate electrode 23B. Accordingly, the low work function liner layer 17L and the first and second impurity regions 25 and 26 overlap with each other.

Below, a method for fabricating the transistor in accordance with the second embodiment of the present invention will be described. FIGS. 5A to 5E are views illustrating an exemplary method for fabricating a transistor in accordance with the second embodiment of the present invention. FIGS. 5A to 5E are cross-sectional views taken along the line B-B' of FIG. 1, illustrating processes.

Figure 5A:
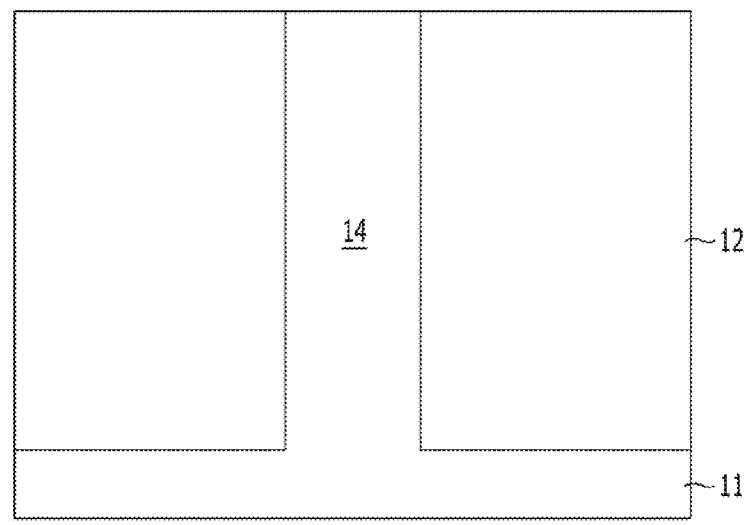
FIGS. 5A to 5E are views illustrating an exemplary method for fabricating the transistor in accordance with the second embodiment of the present invention.

As shown in FIG. 5A, an isolation layer 12 is formed in a substrate 11. An active region 14 is defined by the isolation layer 12. The isolation layer 12 may be formed through an STI process.

Figure 5B:
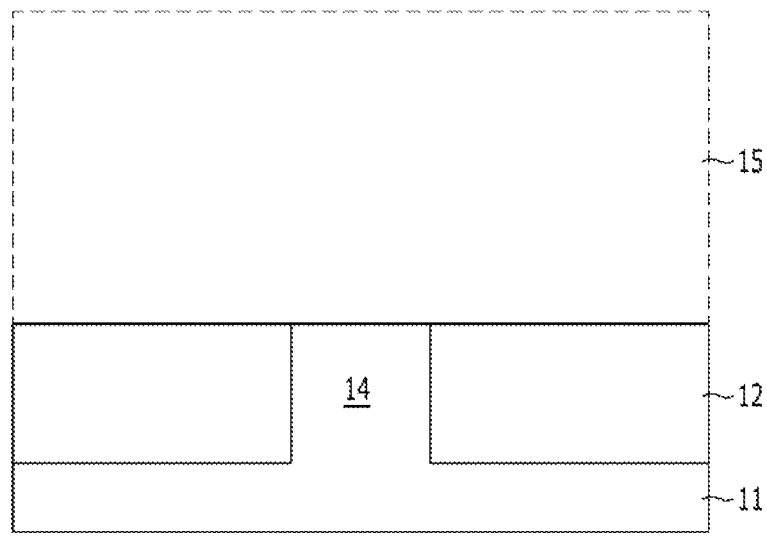

As shown in FIG. 5B, a trench 15 is defined in the substrate 11. The trench 15 may be defined as a line type which extends across the active region 14 and the isolation layer 12. The trench 15 may be defined by forming a mask pattern (not shown) on the substrate 11 and performing an etching process using the mask pattern as an etch mask.

Figure 5C:
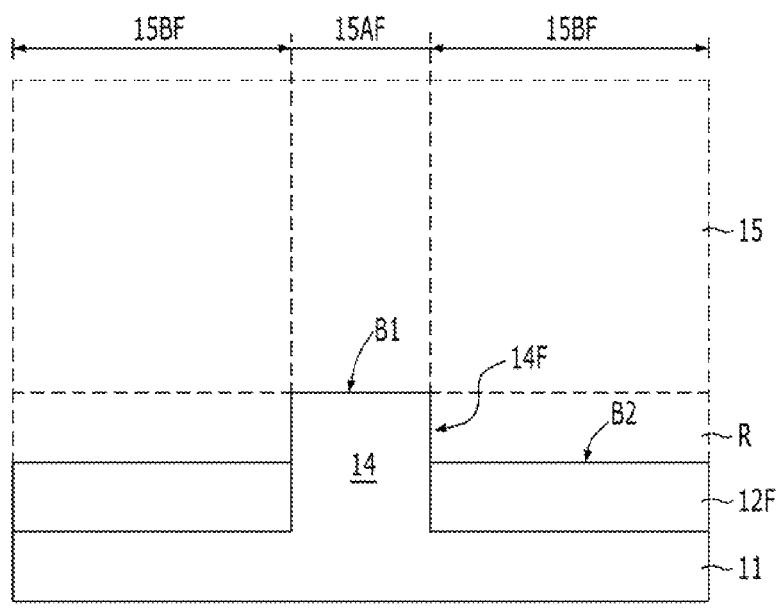

As shown in FIG. 5C, the isolation layer 12 is recessed to a predetermined depth and defines a recess region R. A fin region 14F is formed by the recess region R. The lower portion of the fin region 14F is buried by an isolation layer 12F which is recessed. The trench 15 includes a first trench 15AF and a second trench 15BF. The first trench 15AF is defined in the active region 14. The second trench 15BF is defined in the isolation layer 12 shown in FIG. 5B. The first trench 15AF and the second trench 15BF may communicate with each other. In the trench 15, the first trench 15AF and the second trench 15F may have bottom surfaces B1 and B2 which are positioned at different levels. For example, the bottom surface B1 of the first trench 15AF may be positioned at a higher level than the bottom surface 62 of the second trench 15BF. The height difference between the first trench 15AF and the second trench 15BF is induced as the Isolation layer 12 is recessed on the bottom of the trench 15. The second trench 15BF includes the recess region R which has the bottom surface B2 lower than the bottom surface B1 of the first trench 15AF. Due to the step portion formed between the first trench 15AF and the second trench 15BF, the fin region 14F is formed in the active region 14.

Figure 5D:
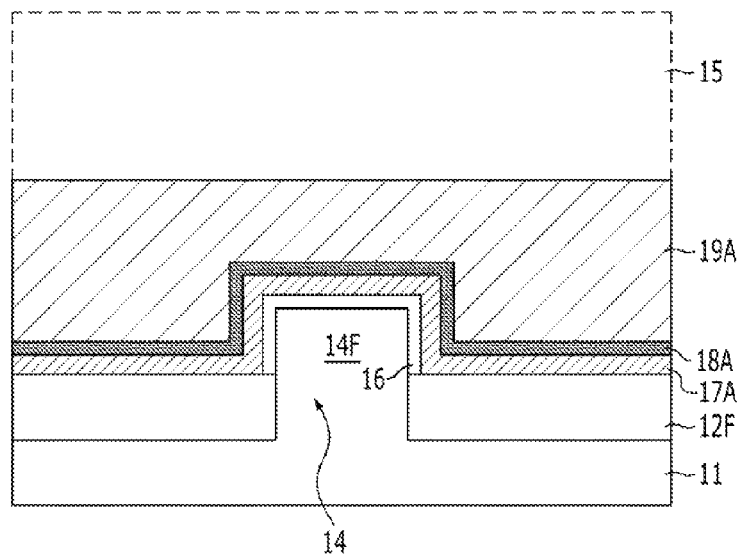

As shown in FIG. 5D, a gate dielectric layer 16 is formed on the fin region 14F.

A first conductive layer 17A, a second conductive layer 18A and a third conductive layer 19A are formed on the gate dielectric layer 16.

Figure 5E:
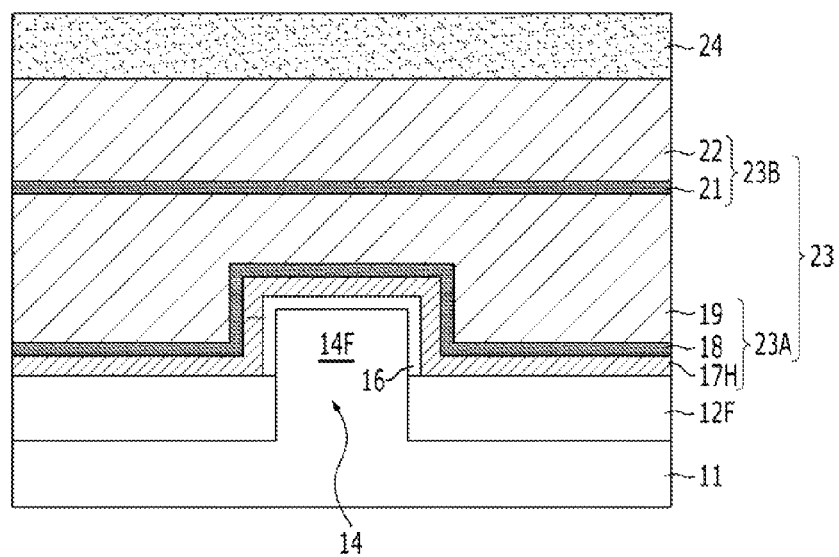

Subsequently, a first recessing process, a doping process, processes for forming a fourth conductive layer and a fifth conductive layer and a second recessing process are sequentially formed, and then, a capping layer, a first impurity region and a second impurity region are formed (see FIGS. 4D to 4H). Accordingly, as shown in FIG. 5E, a buried gate electrode 23, including a lower buried gate electrode 23A and an upper buried gate electrode 23B, is formed. A capping layer 24 is formed on the buried gate electrode 23.

Figure 6A:
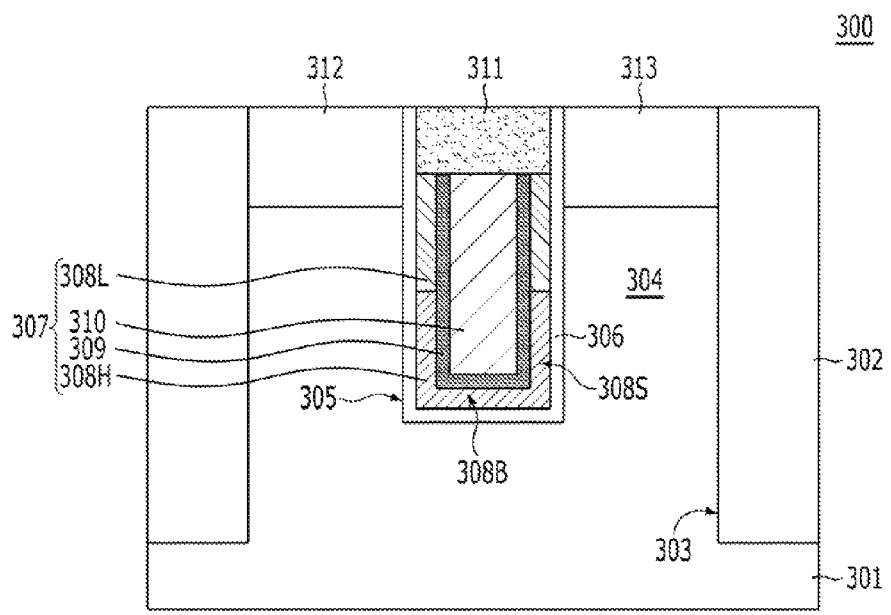
FIGS. 6A and 6B are views illustrating a transistor in accordance with a third embodiment of the present invention.
Figure 6B:
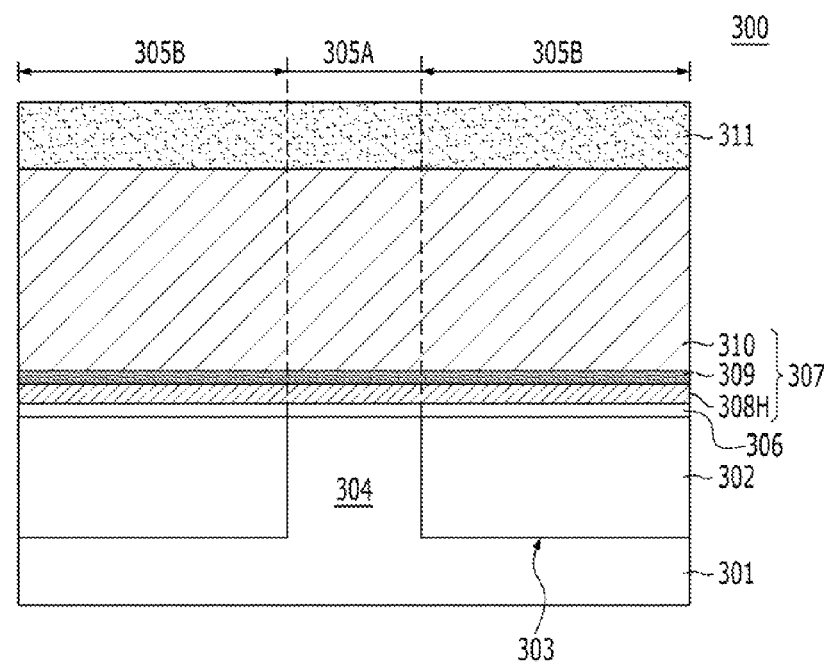

FIGS. 6A and 6B are views illustrating a transistor in accordance with a third embodiment of the present invention. FIG. 6A is a cross-sectional view taken along the line A-A' of FIG. 1. FIG. 66 is a cross-sectional view taken along the line B-B' of FIG. 1.

Referring to FIGS. 6A and 66, a transistor 300 is formed in a substrate 301. An isolation layer 302 is formed in the substrate 301. An active region 304 is defined in the substrate 301 by the isolation layer 302. The isolation layer 302 is filled in an isolation trench 303.

A trench 305 with a predetermined depth is defined in the substrate 301. The trench 305 may be a line type which extends in any one direction. The trench 305 has a shape which extends across the active region 304 and the Isolation layer 302. The trench 305 has a depth that is shallower than the isolation trench 303. The trench 305 includes a first trench 305A and a second trench 305B. The first trench 305A is defined in the active region 304. The second trench 305B is defined in the isolation layer 302. The first trench 305A and the second trench 305B may communicate with each other. The bottom surface of the first trench 305A and the bottom surface of the second trench 305B may be positioned at the same level.

A first impurity region 312 and a second impurity region 313 are formed in the substrate 301. Each of the first impurity region 312 and the second impurity region 313 is doped with a conductivity type impurity. For example, the conductivity type impurity may include phosphorus (P) or boron (B). The first impurity region 312 and the second impurity region 313 are formed in the active region 304 on both sides of the trench 305. The first impurity region 312 and the second impurity region 313 respectively correspond to a source region and a drain region. The bottom surfaces of the first impurity region 312 and the second impurity region 313 may be positioned at a predetermined depth from the top surface of the active region 304. The first impurity region 312 and the second impurity region 313 may define the sidewalls of the trench 305. The bottom surfaces of the first impurity region 312 and the second impurity region 313 may be higher than the bottom surface of the trench 305.

A gate dielectric layer 306 is formed on the bottom surface and the sidewalls of the trench 305.

A buried gate electrode 307 is formed in the trench 305. The buried gate electrode 307 includes a first liner layer 308H, a second liner layer 308L, a barrier layer 309, and a low resistance layer 310. The low resistance layer 310 is partially filled in the trench 305. The first liner layer 308H and the second liner layer 308L are positioned between the low resistance layer 310 and the gate dielectric layer 306. The first liner layer 308H is positioned on the bottom and the sidewalls of the trench 305. The second liner layer 308L is positioned on the sidewalls of the trench 305. The first liner layer 308H has a bottom portion 308B and sidewall portions 308S which extend from the bottom portion 308B. The bottom portion 308B of the first liner layer 308 is positioned on the bottom of the trench 305. The sidewall portions of the first liner layer 308 are positioned on the sidewalls of the trench 305. The first liner layer 308H and the second liner layer 308L are connected with each other. The barrier layer 309 is positioned between the low resistance layer 310 and the first liner layer 308H and the second liner layer 308L. The second liner layer 308L has the shape of a sidewall spacer which extends from the sidewall portions 308S of the first liner layer 308H. The heights of the top surfaces of the second liner layer 308L, the barrier layer 309 and the low resistance layer 310 may be the same. A capping layer 311 is gap-filled on the buried gate electrode 307.

The buried gate electrode 307 will be described below in detail.

The first liner layer 308H and the second liner layer 308L include materials which have different work functions. The work function of the first liner layer 308H is higher than the work function of the second liner layer 308L. The first liner layer 308H includes a high work function material. The second liner layer 308L includes a low work function material. The first liner layer 308H and the second liner layer 308L include polysilicons which have different work functions. The first liner layer 308H may include a P-type polysilicon, and the second liner layer 308L may include an N-type polysilicon. The first liner layer 308H may include a polysilicon which is introduced with a P-type impurity such as boron. The second liner layer 308L may include a polysilicon, which is introduced with an N-type impurity such as phosphorus or arsenic. The first liner layer 308H does not overlap with the first impurity region 312 and the second impurity region 313. The second liner layer 308L partially overlaps with the first impurity region 312 and the second impurity region 313. Since the second liner layer 308L has a low work function, it may be possible to prevent gate-induced drain leakage (GIDL) from occurring in the first impurity region 312 and the second impurity region 313 by the second liner layer 308L. A threshold voltage is controlled by the high work function of the first liner layer 308H. For example, a channel dose may be decreased by the high work function of the first liner layer 308H.

The low resistance layer 310 includes a material which has a specific resistance lower than the first liner layer 308H and the second liner layer 308L. The resistance of the buried gate electrode 307 is decreased by the low resistance layer 310. The low resistance layer 310 may include a metal-containing material such as tungsten, so that the low resistance layer 310 includes a metal-containing material, and the first liner layer 308H and the second liner layer 308L include a non-metal material. Therefore, to decrease the resistance of the buried gate electrode 307, the first liner layer 308H and the second liner layer 308L are formed to a thin thickness.

The barrier layer 309 prevents a reaction between the first and second liner layers 308H and 308L and the low resistance layer 310. For example, the barrier layer 309 may include a titanium nitride.

The channel of the transistor 300 may be defined along the trench 305 between the first impurity region 312 and the second impurity region 313. The buried gate electrode 307 becomes a dual work function buried gate (BG) electrode. The dual work function buried gate electrode includes the first liner layer 308H which has a high work function and the second liner layer 308L which has a low work function. In the buried gate electrode 307 of the third embodiment of the present invention, both the barrier layer 309 and the low resistance layer 310 have a single structure.

Figure 7A:
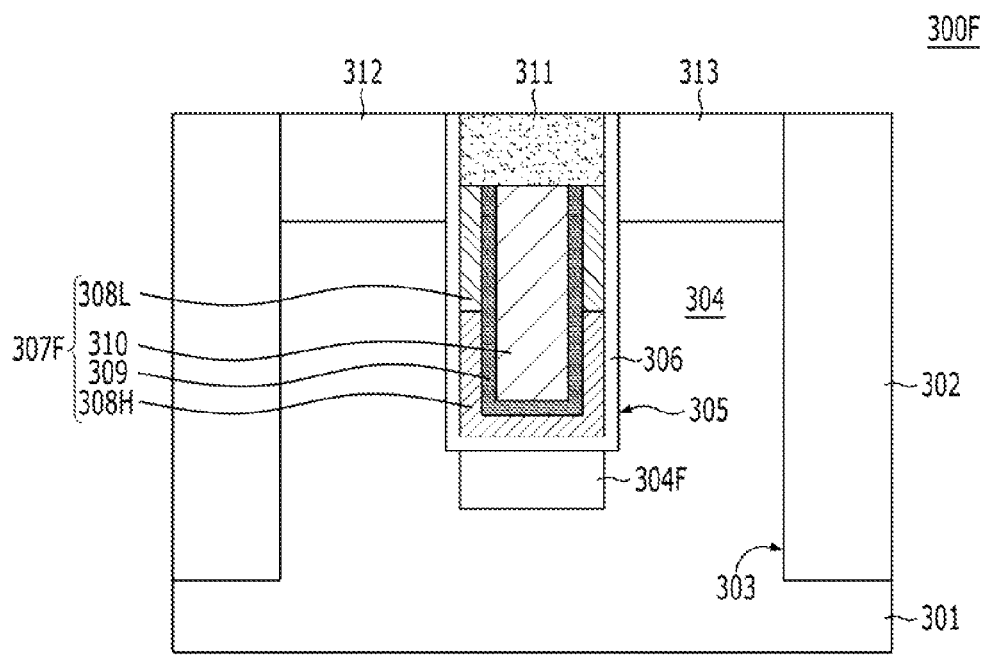
FIGS. 7A and 7B are views illustrating a transistor in accordance with a fourth embodiment of the present invention.
Figure 7B:
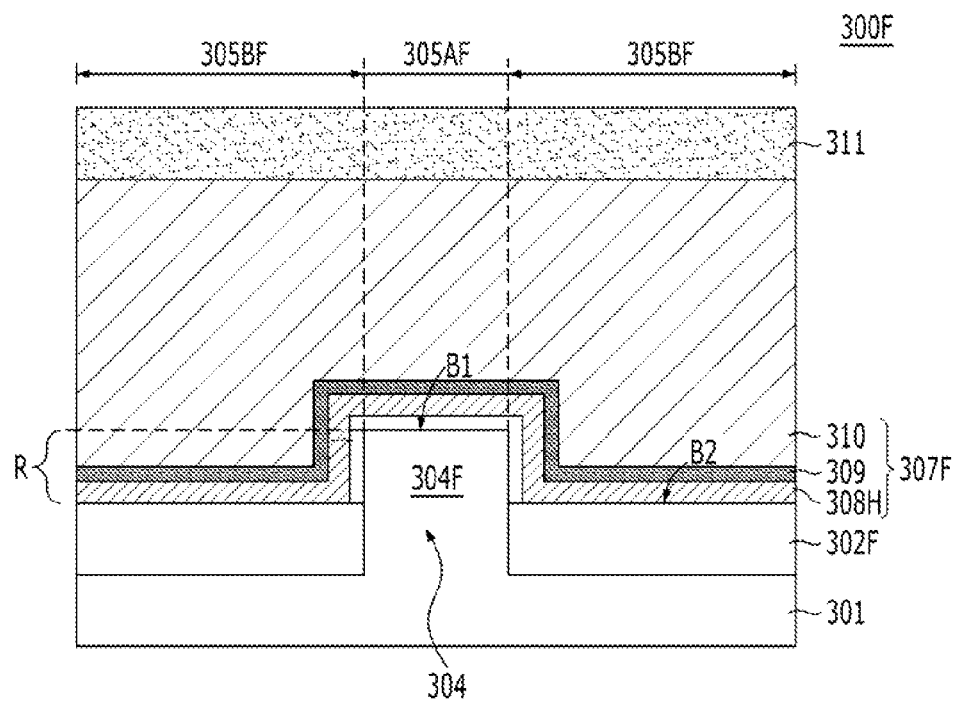

FIGS. 7A and 7B are views illustrating a transistor in accordance with a fourth embodiment of the present invention. FIG. 7A is a cross-sectional view taken along line A-A' of FIG. 1. FIG. 7B is a cross-sectional view taken along line B-B' of FIG. 1. Some components of a transistor 300F in accordance with the fourth embodiment of the present invention may be the same as those of the transistor 300 in accordance with the third embodiment of the present invention.

Referring to FIGS. 7A and 7B, a trench 305 includes a first trench 305AF and a second trench 305BF. The first trench 305AF is defined in an active region 304. The second trench 305BF is defined in an isolation layer 302. The first trench 305AF and the second trench 305BF may communicate with each other. In the trench 305, the first trench 305AF and the second trench 305BF may have bottom surfaces which are positioned at different levels. For example, a bottom surface B1 of the first trench 305AF may be positioned at a higher level than a bottom surface B2 of the second trench 305BF. The height difference between the first trench 305AF and the second trench 305BF is induced as the isolation layer 302 is recessed on the bottom of the trench 305. The second trench 305BF includes a recess region R which has the bottom surface B2 positioned lower than the bottom surface B1 of the first trench 305AF. Due to the step portion formed between the first trench 305AF and the second trench 305BF, a fin region 304F is formed in the active region 304. The lower portion of the fin region 304F is buried by a recessed isolation layer 302F.

A gate dielectric layer 306 is formed on the sidewalls and the top surface of the fin region 304F.

A buried gate electrode 307F is formed in the trench 305. The buried gate electrode 307F includes a first liner layer 308H, a second liner layer 308L, a barrier layer 309, and a low resistance layer 310. The low resistance layer 310 is partially filled in the trench 305. The first liner layer 308H and the second liner layer 308L are positioned between the low resistance layer 310 and the gate dielectric layer 306. The first liner layer 308H is positioned on the bottom and the sidewalls of the trench 305. The second liner layer 308L is positioned on the sidewalls of the trench 305. The first liner layer 308H and the second liner layer 308L are connected with each other. The barrier layer 309 is positioned between the low resistance layer 310 and the first liner layer 308H and is also positioned between the low resistance layer 310 and the second liner layer 308L. The second liner layer 308L has the shape of a sidewall spacer. The heights of the top surfaces of the second liner layer 308L, the barrier layer 309 and the low resistance layer 310 may be the same. The first liner layer 308H and the second liner layer 308L include polysilicons which have different work functions. The first liner layer 308H may include a P-type polysilicon, and the second liner layer 308L may include an N-type polysilicon. The first liner layer 308H may include a polysilicon, which is introduced with a P-type impurity such as boron. The second liner layer 308L may include a polysilicon, which is introduced with an N-type impurity such as phosphorus or arsenic. The first liner layer 308H does not overlap with a first impurity region 312 and a second impurity region 313. The second liner layer 308L partially overlaps with the first impurity region 312 and the second impurity region 313. The first liner layer 308H has a shape which covers the sidewalls and the top surface of the fin region 304F. The low resistance layer 310 is formed in the trench 305 while filling the recess region R. The cross-sectional area of the low resistance layer 310 is wider in the isolation layer 302 than in the active region 304. The second liner layer 308L is not positioned close to the sidewalls of the fin region 304F. Accordingly, the fin region 304F is influenced by the high work function of the first liner layer 308H.

A capping layer 311 is gap-filled on the buried gate electrode 307F.

The transistor 300F is referred to as a buried gate type fin channel transistor. The channel of the transistor 300F may be defined along the trench 305 and the fin region 304F between the first impurity region 312 and the second impurity region 313. The buried gate electrode 307F becomes a dual work function buried gate (BG) electrode. The dual work function buried gate electrode includes the first liner layer 308H which has a high work function and the second liner layer 308L which has a low work function.

According to the third embodiment and the fourth embodiment of the present invention, the low resistance of the buried gate electrodes 307 shown in FIGS. 6A and 6B, and 307F is secured by the low resistance layer 310. A channel dose may be decreased by the high work function of the first liner layer 308H. Gate-induced drain leakage (GIDL) may be reduced by the low work function of the second liner layer 308L. An abnormal reaction between the second liner layer 308L and the low resistance layer 310 may be prevented by the barrier layer 309. Accordingly, it may be possible to prevent the work function of the second liner layer 308L from increasing.

Hereinbelow, a method for fabricating the transistor in accordance with the third embodiment of the present invention will be described. FIGS. 8A to 8F are views illustrating an exemplary method for fabricating the transistor in accordance with the third embodiment of the present invention. FIGS. 8A to 8F are cross-sectional views taken along the line A-A' of FIG. 1.

Figure 8A:
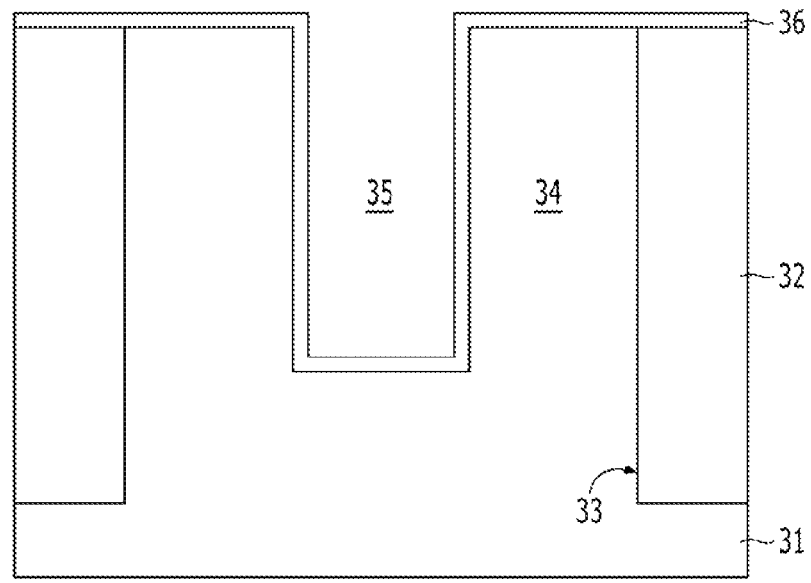
FIGS. 8A to 8F are views illustrating an exemplary method for fabricating the transistor in accordance with the third embodiment of the present invention.

As shown in FIG. 8A, an isolation layer 32 is formed in a substrate 31. An active region 34 is defined by the isolation layer 32. The isolation layer 32 may be formed through an STI (shallow trench isolation) process. A trench 35 is defined in the substrate 31. The trench 35 may be defined as a line type which extends across the active region 34 and the isolation layer 32. A gate dielectric layer 36 is formed on the surface of the trench 35.

Figure 8B:
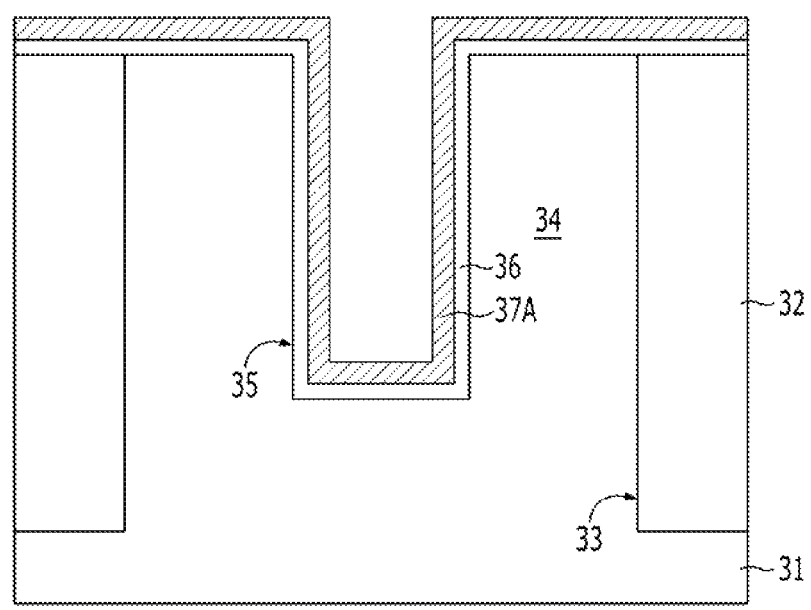

As shown in FIG. 8B, a first conductive layer 37A is formed on the gate dielectric layer 36. The first conductive layer 37A lines the surface of the gate dielectric layer 36. The first conductive layer 37A is introduced with a P-type impurity to have a high work function. The first conductive layer 37A includes a P-type polysilicon. The P-type polysilicon is introduced with boron.

Figure 8C:
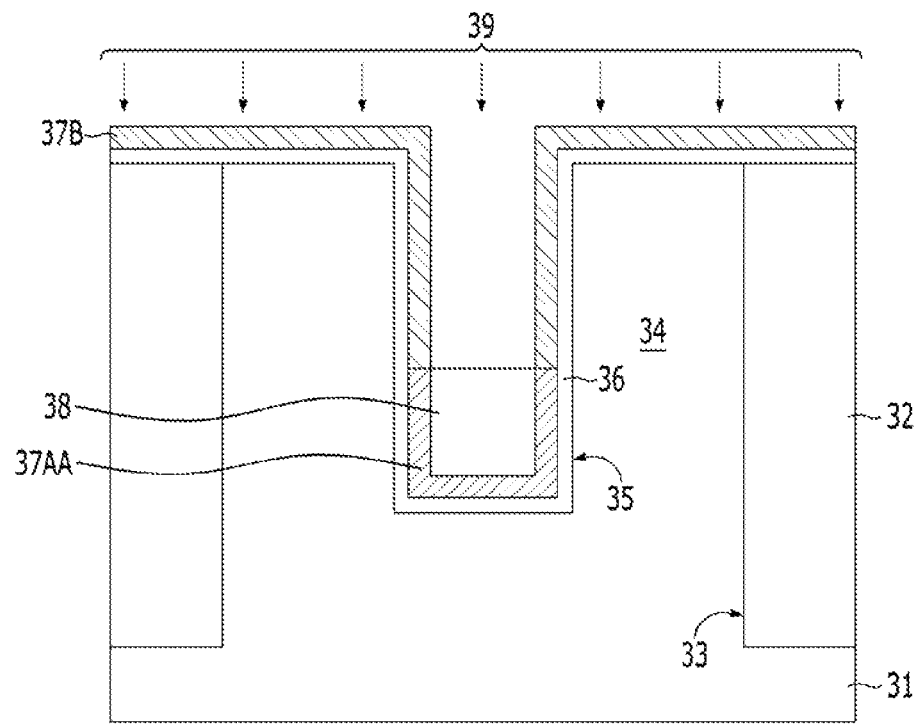

As shown in FIG. 8C, a protective layer 38 is formed on the first conductive layer 37A. The protective layer 38 fills the trench 35. The protective layer 38 may include a photoresist layer. A first recessing process is performed so that the protective layer 38 remains in the trench 35. The first recessing process may be performed by at least an etch-back process. By the first recessing process, the first conductive layer 37A is partially exposed. The lower portion of the first conductive layer 37A is covered by the protective layer 38. The upper portion of the first conductive layer 37A is not covered by the protective layer 38 and is exposed.

A doping process 39 for introducing a work function modulation element is performed. The doping process 39 may include plasma doping. By applying plasma doping, uniform doping is possible. The work function modulation element modulates the work function of the exposed portion of the first conductive layer 37A. By utilizing the work function modulation element, the work function of the exposed portion of the first conductive layer 37A is decreased. The work function modulation element may include an N-type impurity. By the doping process 39, the exposed portion of the first conductive layer 37A is introduced with an N-type impurity. Accordingly, the exposed portion of the first conductive layer 37A is converted into an N-type polysilicon. The N-type polysilicon has a lower work function than a P-type polysilicon. The work function modulation element may include phosphorus (P) or arsenic (As).

By the doping process 39, the exposed portion of the first conductive layer 37A has a low work function. The unexposed portion of the first conductive layer 37A has a high work function. The unexposed portion of the first conductive layer 37A becomes a high work function layer 37AA, and the exposed portion of the first conductive layer 37A becomes a low work function layer 37B.

The high work function layer 37AA is covered by the protective layer 38, and the low work function layer 37B is exposed.

Figure 8D:
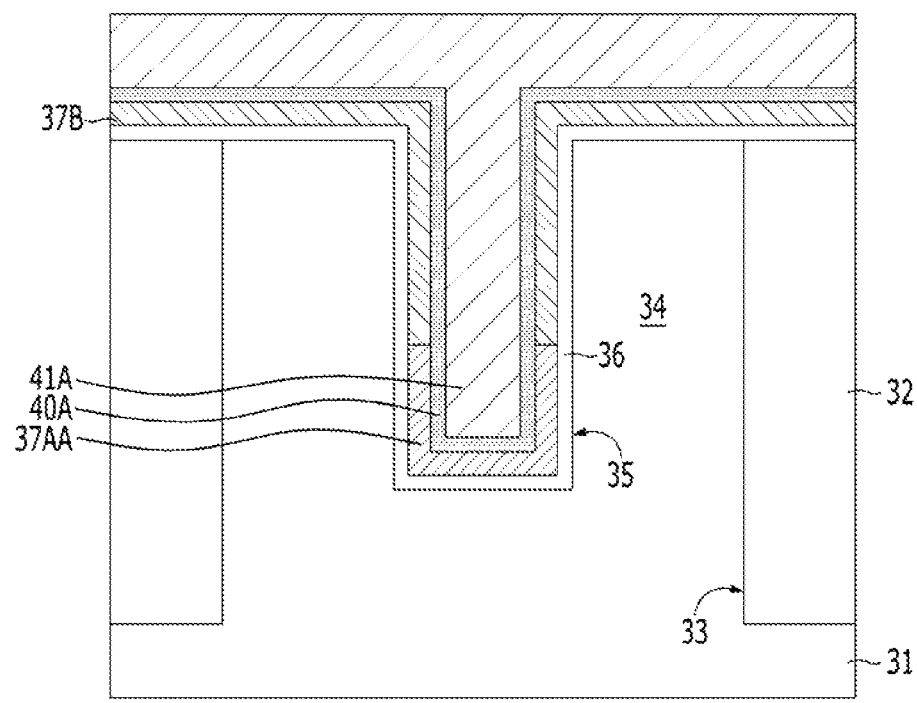

As shown in FIG. 8D, the protective layer 38 is removed.

A second conductive layer 40A is formed on the high work function layer 37AA and the low work function layer 37B. The second conductive layer 40A lines the surfaces of the high work function layer 37AA and the low work function layer 37B. The second conductive layer 40A may include a metal nitride. For example, the second conductive layer 40A may include a titanium nitride.

A third conductive layer 41A is formed on the second conductive layer 40A. The third conductive layer 41A fills the trench 35. The third conductive layer 41A includes a low resistance material and the third conductive layer 41A may include a low resistance metal material. The third conductive layer 41A may include tungsten.

Figure 8E:
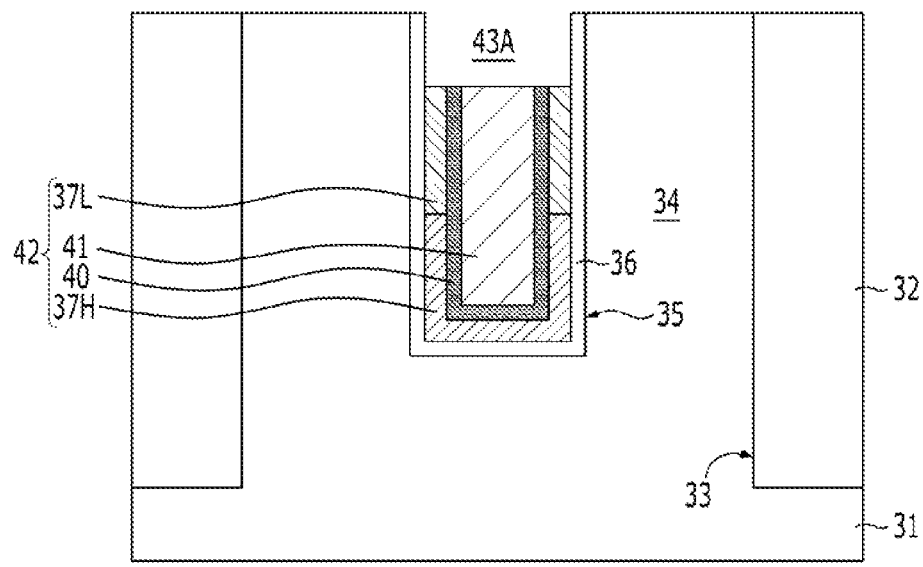

As shown in FIG. 8E, a second recessing process is performed so that the low work function layer 37B, the second conductive layer 40A and the third conductive layer 41A remain in the trench 35. The second recessing process may be performed by an etch-back process. Accordingly, a low work function liner layer 37L, a barrier layer 40 and a low resistance layer 41 are formed. The low work function liner layer 37L is formed by the etch-back process of the low work function layer 37B. The barrier layer 40 is formed by the etch-back process of the second conductive layer 40A shown in FIG. 8D. The low resistance layer 41 is formed by the etch-back process of the third conductive layer 41A shown in FIG. 8D. A planarization process may be performed before an etch-back process. The high work function layer 37AA shown in FIG. 8D becomes a high work function liner layer 37H.

By the first recessing process and the second recessing process described above, a buried gate electrode 42 is formed. The buried gate electrode 42 includes the high work function liner layer 37H, the low work function liner layer 37L, the barrier layer 40, and the low resistance layer 41.

The top end of the buried gate electrode 42 is positioned lower than the top surface of the substrate 31 to define a recessed gap region 43A.

Figure 8F:
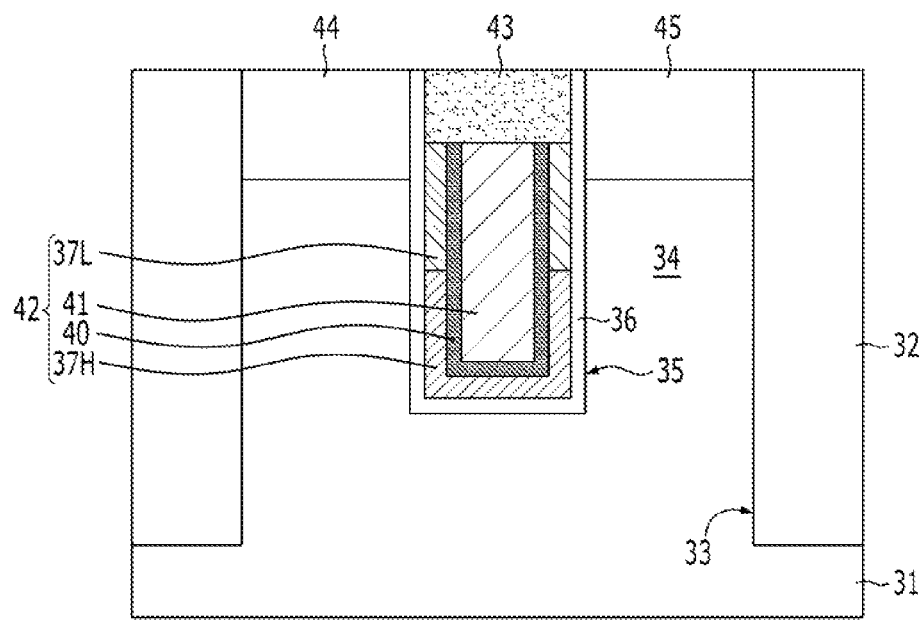

As shown in FIG. 8F, a capping layer 43 is formed on the buried gate electrode 42.

After forming the capping layer 43, a first impurity region 44 and a second impurity region 45 are formed in the substrate 31 by an impurity doping process. The first impurity region 44 and the second impurity region 45 respectively become a source region and a drain region.

The bottom surface of the first impurity region 44 and the second impurity region 45 may have a depth that overlaps with the low work function liner layer 37L.

In a method for fabricating the transistor in accordance with the fourth embodiment of the present invention, the remaining processes (not including the process for forming a fin region) are the same as shown in FIGS. 8A to 8F. For the process of forming a fin region, reference may be made to FIGS. 5A to 5D.

Figure 9:
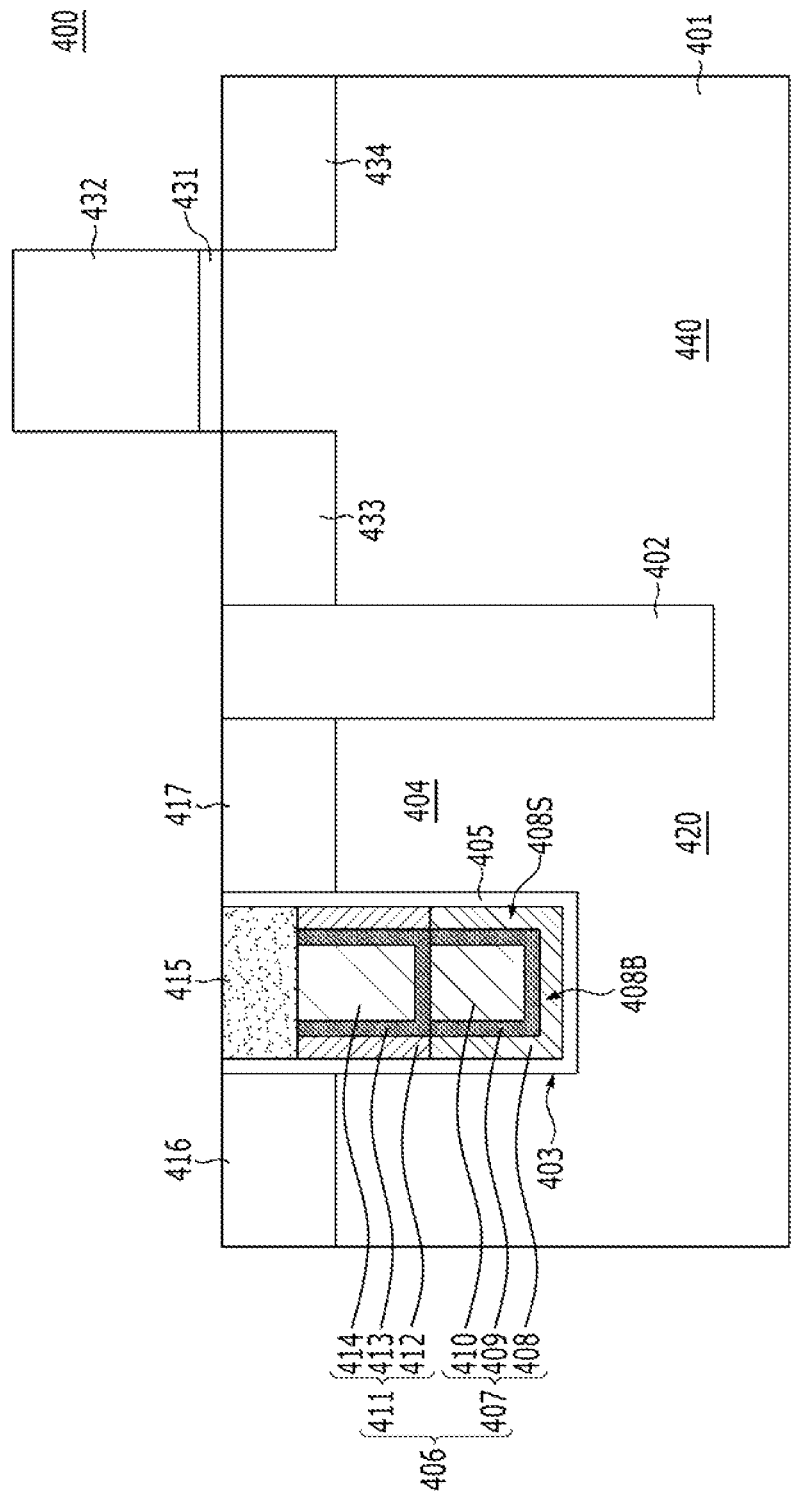
FIG. 9 is a view illustrating an exemplary semiconductor device including the transistor in accordance with the embodiments of the present invention.

FIG. 9 is a view illustrating an exemplary semiconductor device including a transistor in accordance with the embodiments of the present invention.

Referring to FIG. 9, a semiconductor device 400 includes a first transistor 420 and a second transistor 440. The first transistor 420 and the second transistor 440 are formed in a substrate 401, and are isolated from each other by an isolation layer 402.

The first transistor 420 includes a buried gate electrode 406, a first source region 416, and a first drain region 417. The buried gate electrode 406 is formed in a trench 403. The trench 403 has a shape which extends across the isolation layer 402 and an active region 404. A first gate dielectric layer 405 is formed on the surface of the trench 403. The buried gate electrode 406 includes a lower buried gate electrode 407 and an upper buried gate electrode 411. The lower buried gate electrode 407 includes a high work function liner layer 408, a first barrier layer 409 and a first low resistance layer 410. The upper buried gate electrode 411 includes a low work function liner layer 412, a second barrier layer 413 and a second low resistance layer 414. In other embodiments of the present invention, the buried gate electrodes in accordance with the second to fourth embodiments may be applied as the buried gate electrode 406.

The second transistor 440 includes a planar gate electrode 432, a second source region 433, and a second drain region 434. A second gate dielectric layer 431 is formed under the planar gate electrode 432. The planar gate electrode 432 may include a polysilicon, a metal, a metal nitride, a metal compound, or a combination thereof. The second gate dielectric layer 431 may include at least any one selected from a silicon oxide, a silicon nitride, a silicon oxynitride and a high-k material. The high-k material may include a hafnium-based material. The second gate dielectric layer 431, an interface layer and a high-k material may be stacked. The interface layer may include a silicon oxide, a silicon nitride or a silicon oxynitride.

In the semiconductor device 400, the first transistor 420 having the buried gate electrode 406 and the second transistor 440 having the planar gate electrode 432 are integrated in one substrate 401. After forming the first transistor 420, the second transistor 440 may be formed.

In the semiconductor device 400, both the first transistor 420 and the second transistor 440 may be NMOSFETs.

The semiconductor device 400 may be a CMOSFET. For example, the first transistor 420 may become an NMOSFET, and the second transistor 440 may become a PMOSFET. For the PMOSFET, a P-type work function material may be selected to have a work function appropriate for a PMOSFET as the planar gate electrode 432.

The first transistor 420 is referred to as a buried gate type transistor, and the second transistor 440 is referred to as a planar gate type transistor. The planar gate type transistor is an example of a non-buried gate type transistor. The non-buried gate type transistor may further include a fin type transistor which is generally known in the art. The fin type transistor is different from a buried gate type fin channel transistor. In the fin type transistor, the fin region is formed by recessing an isolation layer to expose an active region, without defining a trench.

In the semiconductor device 400, the first transistor 420 may become the transistor of a memory cell, and the second transistor 440 may become the transistor of a peripheral circuit region.

As a result, due to the fact that the buried gate electrode 406 including the high work function liner layer 408 and the low work function liner layer 412 is formed in such a way that the low work function liner layer 412 overlaps with the first source region 416 and the first drain region 417, not only may gate resistance be decreased, but also gate-induced drain leakage (GIDL) may be reduced.

Accordingly, the performance of the semiconductor device 400 may be improved.

Figure 10:
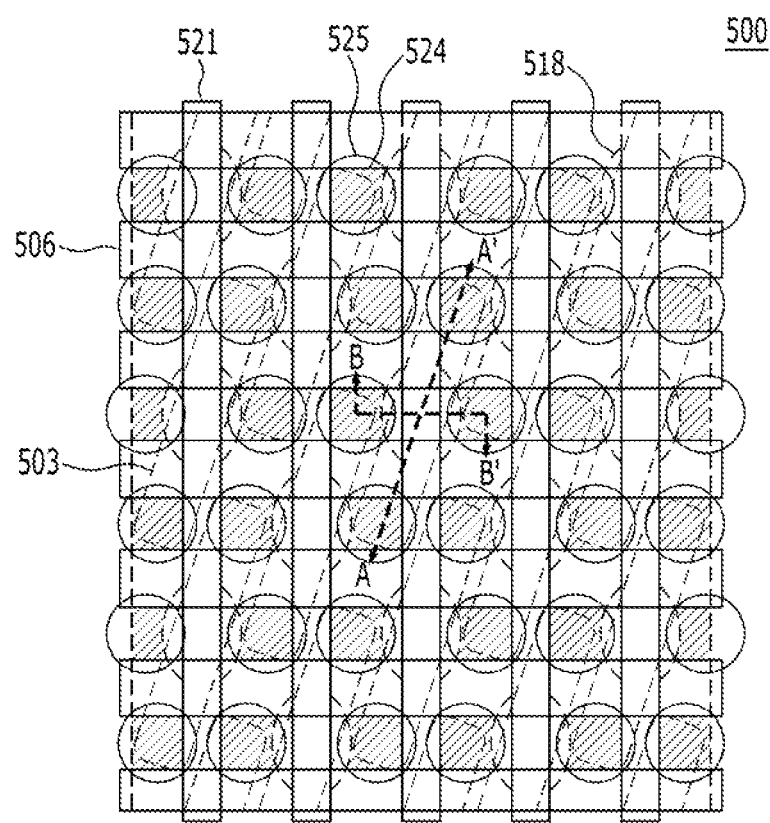
FIG. 10 is a plan view illustrating another exemplary semiconductor device including the transistor in accordance with the embodiments of the present invention.
Figure 11A:
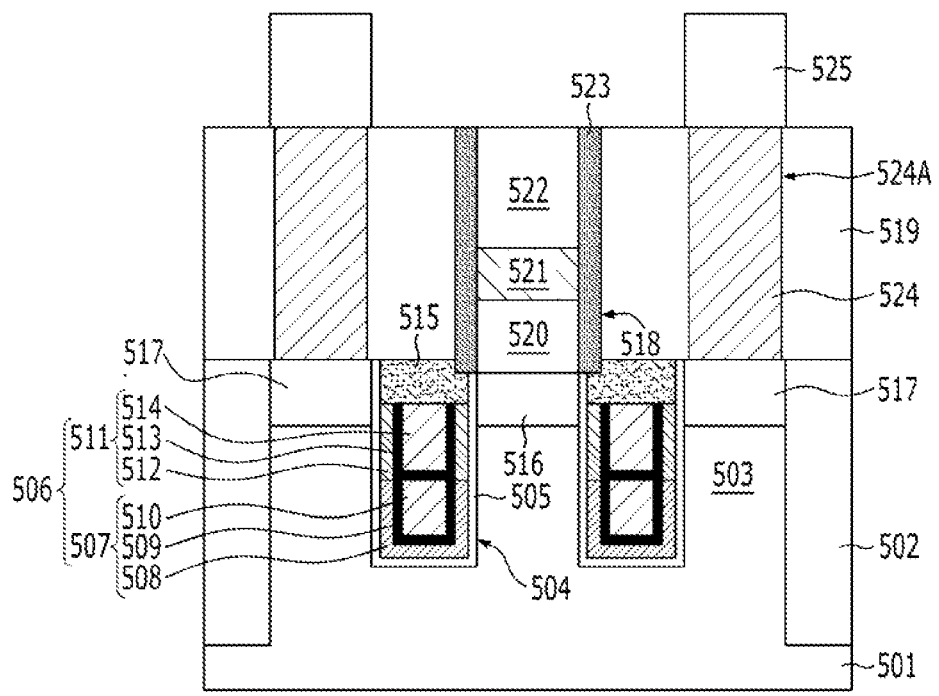
FIG. 11A illustrates a cross-sectional view taken along the line A-A' of FIG. 10.
Figure 11B:
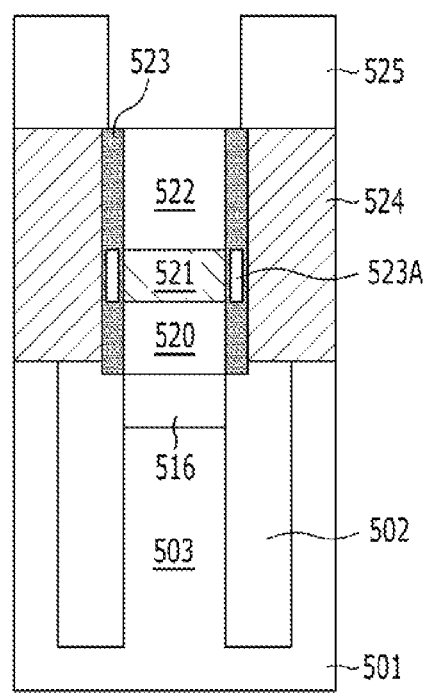
FIG. 11B illustrates a cross-sectional view taken along the line B-B' of FIG. 10.

FIG. 10 is a plan view illustrating another exemplary semiconductor device including the buried gate type transistor in accordance with the embodiments of the present invention. FIG. 10 is a plan view illustrating the memory cell array of a memory device. FIG. 11A is a cross-sectional view taken along the line A-A' of FIG. 10. FIG. 11B is a cross-sectional view taken along the line B-B' of FIG. 10.

Referring to FIGS. 10, 11A and 11B, a memory cell array 500 includes a plurality of buried word lines 506, a plurality of bit lines 521 which extend in a direction crossing with the buried word lines 506, and a plurality of memory elements 525.

The memory cell array 500 will be described below in detail.

An isolation layer 502 is formed in a substrate 501. A plurality of active regions 503 are defined by the isolation layer 502. Gate trenches 504 are defined to extend across the active regions 503. A gate dielectric layer 505 is formed on the surface of the gate trenches 504.

The buried word lines 506 are formed on the gate dielectric layer 505 to partially fill the gate trenches 504. Each of the buried word lines 506 includes a lower buried word line 507 and an upper buried word line 511. The lower buried word line 507 includes a high work function liner layer 508, a first barrier layer 509 and a first low resistance layer 510. The upper buried word line 511 includes a low work function liner layer 512, a second barrier layer 513 and a second low resistance layer 514. The buried word line 506 has the same construction as the buried gate electrode 507 in accordance with the first embodiment of the present invention. In other embodiments, the buried gate electrodes in accordance with the second to fourth embodiments may be applied as the buried word lines 506.

A capping layer 515 is formed on the buried word line 506. A fin region (not shown) may be additionally formed on the bottom of the buried word line 506. A first impurity region 516 and a second impurity region 517 are formed in the substrate 501 on both sides of the buried word line 506.

A bit line structure which is electrically connected with the first impurity region 516 may be formed. The bit line structure includes a bit line 521 and a bit line hard mask layer 522. The bit line structure may further include a first contact plug 520 which is interposed between the bit line 521 and the first impurity region 516. Spacers 523 are formed on the sidewalls of the bit line structure. An isolation layer 519 is formed on the substrate 501. The first contact plug 520 may be formed in a first contact hole 518. The first contact plug 520 is electrically connected with the first impurity region 516. The diameter of the first contact hole 518 may be larger than the line width of the bit line 521. The line widths of the first contact plug 520 and the bit line 521 may be the same. Therefore, gaps are defined between the first contact plug 520 and the sidewalls of the first contact hole 518, and the portions of the spacers 523 extend to fill in the gaps. The surface of the first impurity region 516 may be recessed so that the contact area between the first contact plug 520 and the first impurity region 516 increases. The bit line 521 may be a line type which extends in a direction crossing the buried word line 506 lengthwise. The bit line 521 may include at least one selected among a polysilicon, a metal silicide, a metal nitride and a metal. The bit line hard mask layer 522 may include a silicon oxide or a silicon nitride. The first contact plug 520 may include at least one selected among a polysilicon, a metal silicide, a metal nitride and a metal.

The spacers 523 include a dielectric material. The spacers 523 may include a silicon oxide, a silicon nitride or a combination of a silicon oxide and a silicon nitride. The spacers 523 may have a multi-spacer structure. For example, the spacers 523 may have an NON structure of a silicon nitride/a silicon oxide/a silicon nitride. The spacers 523 may also have an air-gap embedded multi-spacer structure. Air gaps 523A may be defined between the bit line 521 and second contact plugs 524. The spacers 523 may have an N-Air-N structure in which air gaps 523A are positioned between silicon nitrides. The air gaps 523A may be positioned between the bit line 521 and the second contact plugs 524. Further, the air gaps 523A may extend to be positioned between the first contact plug 520 and the second contact plugs 524. The parasitic capacitance between the bit line 521 and the second contact plugs 524 is decreased by the presence of the air gaps 523A. Since the parasitic capacitance is decreased, a sensing margin may be improved.

The memory element 525 may be formed on the second impurity region 517. The second contact plug 524 may be formed between the memory element 525 and the second impurity region 517. A second contact hole 524A is defined to pass through the isolation layer 519, and each second contact plug 524 is formed in the second contact hole 524A. The second contact plug 524 is electrically connected with the second impurity region 517. The second contact plug 524 may include at least any one selected among a polysilicon, a metal, a metal silicide and a metal nitride. For example, the second contact plug 524 may include a plug structure in which a polysilicon, a metal silicide and a metal are stacked.

The isolation layer 519 may be a single layer or a multi-layer. The isolation layer 519 may include at least any one selected among a silicon oxide, a silicon nitride and a silicon oxynitride. The isolation layer 519 may be formed through a damascene process or the like. The isolation layer 519 serves to isolate adjacent second contact plugs 524 from each other. In another embodiment of the present invention, contact spacers which surround the sidewalls of the second contact plugs 524 may be additionally formed. The contact spacers may have an air-gap embedded multi-spacer structure or the spacers 523 may not have the air gaps 523A. The top surfaces of the isolation layer 519 and the bit line structure may be positioned at the same level.

In another embodiment, third contact plugs (not shown) may be additionally formed on the second contact plugs 524. Each of the third contact plugs may have a shape which overlaps with the bit line structure and the second contact plug 524. The third contact plugs may include a metal material.

The memory element 525 which is electrically connected with the second contact plug 524 may be formed on the second contact plug 524. The memory element 525 may be realized in various forms.

The memory element 525 may be a capacitor. Accordingly, the memory element 525 may include a storage node which contacts the second contact plug 524. The storage node may have a cylinder shape or a pillar shape. A capacitor dielectric layer may be formed on the surface of the storage node. The capacitor dielectric layer may include at least one selected among a zirconium oxide, an aluminum oxide and a hafnium oxide. For example, the capacitor dielectric layer may have a ZAZ structure in which a first zirconium oxide, an aluminum oxide and a second zirconium oxide are stacked. A plate node may be formed on the capacitor dielectric layer. Each of the storage node and the plate node may include a metal-containing material.

The memory element 525 may include a variable resistor. The variable resistor may include a phase change material. The phase change material may include at least one selected between Te and Se as chalcogenide elements. In another embodiment, the variable resistor may include a transition metal oxide. In still another embodiment, the variable resistor may be a magnetic tunnel junction (MTJ).

Due to the fact that the buried word line 506, including the high work function liner layer 508 and the low work function liner layer 512, is formed in such a way that the low work function liner layer 512 overlaps with the first impurity region 516 and the second impurity region 517, not only may gate resistance be decreased, but also gate-induced drain leakage (GIDL) may be reduced.

Accordingly, it may be possible to extend data retention time and improve refresh characteristics.

The transistors according to the embodiments of the present invention may be integrated in transistor circuits. Also, the transistors according to the embodiments of the present invention may be applied to integrated circuits including transistors for various purposes. For example, the transistors according to the embodiments of the present invention may be applied to integrated circuits including an IGFET (insulated gate FET), an HEMT (high electron mobility transistor), a power transistor, a TFT (thin film transistor), and so forth.

The transistors and the integrated circuits according to the embodiments of the present invention may be built into an electronic device. The electronic device may include a memory portion and a non-memory portion. The memory portion may include an SRAM, a DRAM, a FLASH, an MRAM, a ReRAM, an STTRAM, an FeRAM, and the like. The non-memory portion may include a logic circuit. The logic circuit may include a sense amplifier, a decoder, an input/output circuit and so forth, for controlling a memory device. Also, the logic circuit may include various integrated circuits (ICs) other than a memory. For example, the logic circuit includes a microprocessor, an application processor of a mobile device, and so forth. Further, the non-memory portion includes a logic gate such as a NAND gate, a driver IC for a display device, a power semiconductor device such as a power management IC (PMIC), and so forth. The electronic device may include a computing system, an image sensor, a camera, a mobile device, a display device, a sensor, a medical instrument, an optoelectronic device, an RFID (radio frequency identification), a photovoltaic cell, a semiconductor device for an automobile, a semiconductor device for a railroad car, a semiconductor device for an aircraft, and so forth.

Hereafter, various application examples including the transistor according to the embodiments of the present invention will be described.

Figure 12A:
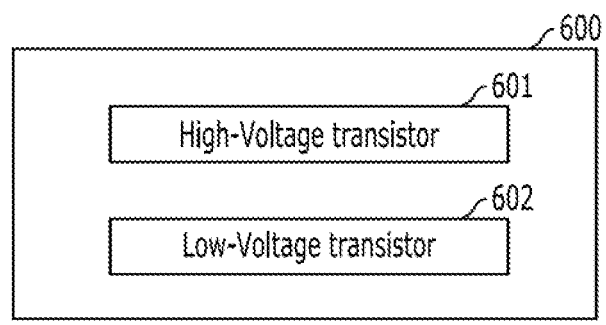
FIGS. 12A to 12C are diagrams illustrating various application examples of an integrated circuit including transistors according to embodiments of the present invention.
Figure 12B:
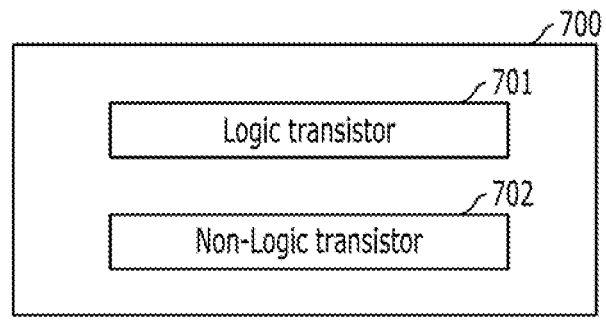
Figure 12C:
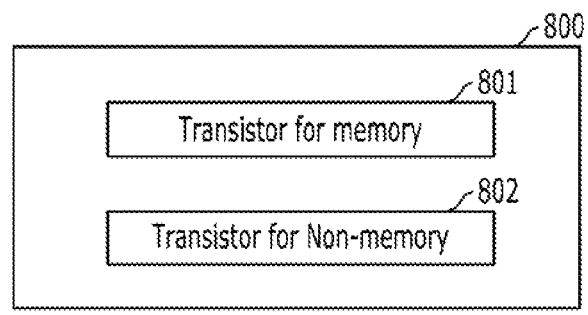

FIGS. 12A to 12C are diagrams illustrating various application examples of an integrated circuit including transistors according to the embodiments of the present invention.

The integrated circuit 600 shown in FIG. 12A includes a plurality of high voltage transistors 601 and a plurality of low voltage transistors 602.

The integrated circuit 700 shown in FIG. 12B includes a plurality of logic transistors 701 and a plurality of non-logic transistors 702.

The integrated circuit 800 shown in FIG. 12C includes transistors 801 for a memory device and transistors 802 for a non-memory device.

The above-described high voltage transistors 601, low voltage transistors 602, logic transistors 701, non-logic transistors 702, transistors 801 for a memory device, and transistors 802 for a non-memory device may include the buried gate type transistors according to the embodiments of the present invention. A buried gate type transistor included in the integrated circuits 600, 700 and 800 includes a buried gate electrode which is formed in a trench. The buried gate electrode includes a dual work function buried gate electrode. The buried gate electrode includes a high work function liner layer, a low work function liner layer, a barrier layer, and a low resistance layer. The low work function liner layer overlaps with a source region and a drain region and, therefore, improves gate-induced drain leakage (GIDL) characteristics.

Therefore, it is possible to improve the performance of the integrated circuits 600, 700 and 800.

Figure 13:
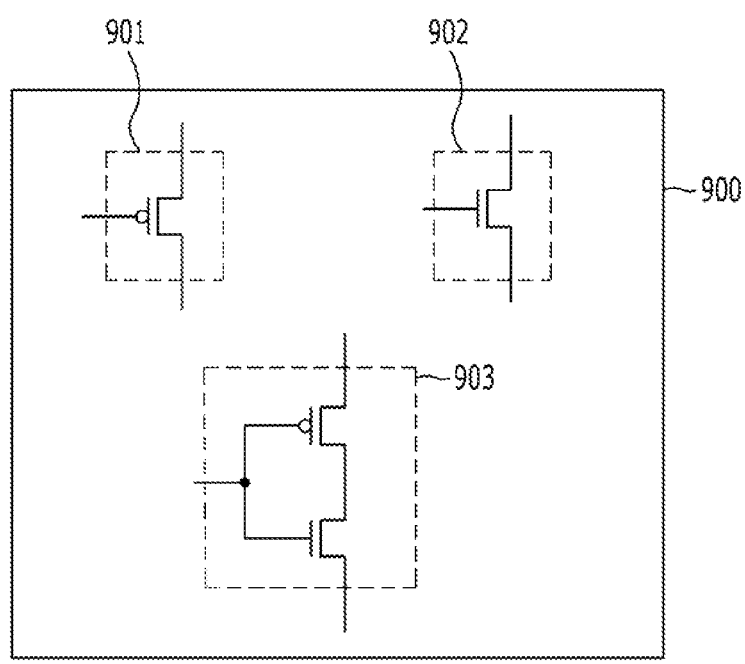
FIG. 13 is a diagram illustrating an electronic device including transistors according to embodiments of the present invention.

FIG. 13 is a diagram illustrating an electronic device including transistors according to the embodiments of the present invention.

Referring to FIG. 13, the electronic device 900 includes a plurality of transistors. The electronic device 900 may include a plurality of PMOSFETs 901, a plurality of NMOSFETs 902 and a plurality of CMOSFETs 903. The PMOSFETs 901, the NMOSFETs 902 and the CMOSFETs 903 may include a buried gate type transistors according to the embodiments of the present invention. A buried gate type transistor included in the electronic device 900 includes a buried gate electrode which is formed in a trench. The buried gate electrode includes a dual work function buried gate electrode. The buried gate electrode includes a high work function liner layer, a low work function liner layer, a barrier layer, and a low resistance layer. The low work function liner layer overlaps with a source region and a drain region, and therefore, improves gate-induced drain leakage (GIDL) characteristics. Accordingly, the electronic device 900 may be scaled down and operate at high speed.

As is apparent from the above descriptions, according to the embodiments of the present invention, since a low work function layer is formed between a buried gate electrode and source/drain regions, current drivability may be improved and gate-induced drain leakage (GIDL) may be reduced.

Also, according to the embodiments of the present invention, since a barrier layer is formed between a low resistance layer and the low work function layer, it may be possible to prevent a reaction between the low resistance layer and the low work function layer, thereby suppressing the work function change and contact resistance increase of the low work function layer.

Further, according to the embodiments of the present invention, a channel dose may be decreased by a high work function layer.

According to the embodiments of the present invention, due to the fact that the buried gate electrode including the high work function layer and the low work function layer is formed so that the low work function layer overlaps with the source/drain regions, not only may gate resistance be decreased, but also gate-induced drain leakage (GIDL) may be reduced.

Although various embodiments have been described for illustrative purposes, it will be apparent to those skilled in the art that various changes and modifications may be made without departing from the spirit and scope of the disclosure as defined in the following claims.

What is claimed is:

1. A transistor comprising:
a source region and a drain region separately formed in a substrate;
a trench defined in the substrate between the source region and the drain region; and
a buried gate electrode formed in the trench,
wherein the buried gate electrode includes:
a high work function liner layer having a bottom portion, which is positioned over a bottom of the trench, and sidewall portions, which are positioned on lower sidewalls of the trench;
a low work function liner layer positioned on upper sidewalls of the trench, and overlapping with the source region and the drain region;
a first barrier layer having vertical and horizontal portions interposed between the high work function liner layer and a first low resistance layer; and
a second barrier layer having vertical portions interposed between the low work function liner layer and a second low resistance layer and a horizontal portion interposed between the first and second low resistance layers, wherein the first low resistance layer and the second low resistance layer partially fill the trench.

2. The transistor according to claim 1, wherein the high work function liner layer and the low work function liner layer include a high work function polysilicon layer and a low work function polysilicon layer, respectively.

3. The transistor according to claim 1, wherein the high work function liner layer includes a P-type polysilicon layer, and the low work function liner layer includes an N-type polysilicon layer.

4. The transistor according to claim 1, wherein the first and second low resistance layers includes a metal-containing material, which has a specific resistance lower than the high work function liner layer and the low work function liner layer.

* * * * *